United States Patent
Olivadese et al.

(10) Patent No.: US 11,605,772 B2
(45) Date of Patent: Mar. 14, 2023

(54) VERTICAL DISPERSIVE READOUT OF QUBITS OF A LATTICE SURFACE CODE ARCHITECTURE

(71) Applicant: International Business Machines Corporation, Armonk, NY (US)

(72) Inventors: Salvatore Bernardo Olivadese, Stamford, CT (US); Patryk Gumann, Tarrytown, NY (US); Jay M. Gambetta, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 172 days.

(21) Appl. No.: 16/998,630

(22) Filed: Aug. 20, 2020

(65) Prior Publication Data

US 2020/0381608 A1 Dec. 3, 2020

Related U.S. Application Data

(62) Division of application No. 16/056,077, filed on Aug. 6, 2018, now Pat. No. 10,811,588.

(51) Int. Cl.
*H01L 39/22* (2006.01)
*G06N 10/00* (2022.01)
(Continued)

(52) U.S. Cl.
CPC ............ *H01L 39/223* (2013.01); *G06N 10/00* (2019.01); *H01L 25/0657* (2013.01); *H01L 27/18* (2013.01); *H01L 39/2493* (2013.01)

(58) Field of Classification Search
CPC ........ H03K 19/195–1958; H03K 17/92; H01L 39/223–226
See application file for complete search history.

(56) References Cited

U.S. PATENT DOCUMENTS

| | | | |
|---|---|---|---|
| 7,624,088 | B2 | 11/2009 | Johnson et al. |
| 9,524,470 | B1 | 12/2016 | Chow et al. |

(Continued)

FOREIGN PATENT DOCUMENTS

| | | |
|---|---|---|
| CA | 3036059 A1 | 3/2018 |
| WO | 2018/169585 A1 | 9/2018 |

OTHER PUBLICATIONS

Non-Final Office Action received for U.S. Appl. No. 16/056,077 dated Nov. 13, 2019, 97 pages.
(Continued)

*Primary Examiner* — Jarrett J Stark
(74) *Attorney, Agent, or Firm* — Amin, Turocy & Watson, LLP

(57) ABSTRACT

Devices and methods that can facilitate vertical dispersive readout of qubits of a lattice surface code architecture are provided. According to an embodiment, a device can comprise a first substrate that can have a first side and a second side that can be opposite the first side. The first substrate can comprise a read pad that can be located on the first side and a readout resonator that can be located on the second side. The device can further comprise a second substrate that can be connected to the first substrate. The second substrate can comprise a qubit. In some embodiments, the device can further comprise a recess that can be located on the first side of the first substrate. The recess can comprise the read pad.

5 Claims, 12 Drawing Sheets

(51) Int. Cl.
  *H01L 25/065* (2023.01)
  *H01L 27/18* (2006.01)
  *H01L 39/24* (2006.01)

(56) References Cited

U.S. PATENT DOCUMENTS

| | | | |
|---|---|---|---|
| 9,779,360 B2 | 10/2017 | Bunyk et al. | |
| 9,892,365 B2 | 2/2018 | Rigetti et al. | |
| 9,971,970 B1* | 5/2018 | Rigetti | H01L 23/552 |
| 10,263,170 B1* | 4/2019 | Brink | H01L 39/223 |
| 10,305,015 B1* | 5/2019 | Brink | H01L 39/2416 |
| 10,535,809 B1* | 1/2020 | Vodrahalli | H01L 39/025 |
| 10,593,858 B2* | 3/2020 | Brink | H01L 39/2406 |
| 2007/0246254 A1* | 10/2007 | Kumar | H05K 3/4623 174/264 |
| 2008/0278166 A1* | 11/2008 | Wosik | G01R 33/34007 324/318 |
| 2014/0264287 A1 | 9/2014 | Abraham et al. | |
| 2016/0071021 A1 | 3/2016 | Raymond | |
| 2016/0364653 A1 | 12/2016 | Chow et al. | |
| 2018/0013052 A1* | 1/2018 | Oliver | G06N 10/00 |
| 2018/0069288 A1 | 3/2018 | Minev et al. | |
| 2019/0164959 A1* | 5/2019 | Thomas | G06N 10/00 |
| 2019/0165237 A1* | 5/2019 | Hertzberg | H03K 19/195 |
| 2019/0229094 A1* | 7/2019 | White | H01L 25/0657 |
| 2020/0012961 A1* | 1/2020 | Kelly | H01L 25/0657 |
| 2020/0043977 A1* | 2/2020 | Adiga | H01L 39/223 |
| 2020/0119251 A1* | 4/2020 | Yohannes | H01L 24/05 |
| 2022/0199507 A1* | 6/2022 | Abraham | H01L 23/49888 |

OTHER PUBLICATIONS

Siddiqi, et al., "Dispersive measurements of superconducting qubit coherence with a fast latching readout", Physical Review, Feb. 23, 2006, 6 pages.
Minev, et al., "Planar multilayer circuit quantum electrodynamics", May 31, 2016, 9 pages.
Foxen, et al., "Qubit compatible superconducting interconnects", Quantum Sci. Technol., Nov. 30, 2017, vol. 3, 12 pages.
Rosenberg, et al., "3D integrated superconducting qubits", Quantum Information Oct. 9, 2017, 5 pages.
Koch, et al., "Charge-insensitive qubit design derived from the Cooper pair box", Physical review, Oct. 12, 2007, 19 pages.
Final Office Action received for U.S. Appl. No. 16/056,077 dated Feb. 26, 2020, 175 pages.
Girvin, Steven M. "Circuit QED: superconducting qubits coupled to microwave photons", Proc. of the 2011 Les Houches Summer School on Quantum Machines, 2014, 155 pages.
Notice of Allowance received for U.S. Appl. No. 16/056,077 dated Jun. 16, 2020, 22 pages.

* cited by examiner

|    | Eigenmode | Frequency (GHz)     | Q           |
|----|-----------|---------------------|-------------|
| 2D | Mode 1    | 4.97301 +j 2.28316… | 1.08906e+07 |
| 3D | Mode 1    | 4.94718 +j 2.26705… | 1.09111e+07 |

| Cap [fF] | 2D   | 3D    |
|----------|------|-------|
| Bus *    | 11.3 | 11.31 |
| Read **  | 4.6  | 4.5   |

* Bus1 to Pad1
** Cumulative Readout Coupling (i.e., Pad1 + Pad2)

VERTICAL DISPERSIVE READOUT OF QUBITS OF A LATTICE SURFACE CODE ARCHITECTURE

The subject disclosure relates to superconducting devices, and more specifically, to a vertical dispersive qubit readout device fabricated on semiconductor substrates.

Quantum computing is generally the use of quantum-mechanical phenomena for the purpose of performing computing and information processing functions. Quantum computing can be viewed in contrast to classical computing, which generally operates on binary values with transistors. That is, while classical computers can operate on bit values that are either 0 or 1, quantum computers operate on quantum bits that comprise superpositions of both 0 and 1, can entangle multiple quantum bits, and use interference.

Quantum computing hardware can be different from classical computing hardware. In particular, superconducting quantum circuits generally rely on Josephson junctions, which can be fabricated in a semiconductor device. A Josephson junction generally manifests the Josephson effect of a supercurrent, where current can flow indefinitely across a Josephson junction without an applied voltage. A Josephson junction can be created by weakly coupling two superconductors (a material that conducts electricity without resistance), for example, by a tunnel barrier.

One way in which a Josephson junction can be used in quantum computing is by embedding the Josephson junction in a superconducting circuit to form a quantum bit (qubit). A Josephson junction can be used to form a qubit by arranging the Josephson junction in parallel with a shunting capacitor. A plurality of such qubits can be arranged on a superconducting quantum circuit fabricated on a semiconductor device. The qubits can be arranged in a lattice (i.e., a grid) formation such that they can be coupled to nearest-neighbor qubits. Such an arrangement of qubits coupled to nearest-neighbor qubits can constitute a quantum computing architecture. An example of an existing quantum computing architecture is the quantum surface code architecture, which can further comprise microwave readout resonators coupled to the respective qubits that facilitate reading quantum information of the qubits (i.e., also referred to as "addressing" or "reading a quantum logic state of the qubit"). Such a quantum surface code architecture can be integrated on a semiconducting device to form an integrated quantum processor that can execute computations and information processing functions that are substantially more complex than can be executed by classical computing devices (e.g., general-purpose computers, special-purpose computers, etc.).

Challenges associated with designing a quantum surface code architecture include, but are not limited to: designing such an architecture that can be integrated on a semiconducting device using current semiconductor fabrication techniques (e.g., photolithography, etching, material deposition, etc.) without complicating such fabrication process; designing such an architecture that is not overly complex with respect to functionality and/or components (i.e., does not comprise a substantially high number of components and/or intricate components); designing such an architecture that enables readout of a substantial (e.g., indefinite) quantity of qubits; designing such an architecture without compromising mechanical or electrical integrity of the device; designing such an architecture that enables consistent (i.e., constant) capacitive coupling necessary to address the respective qubits; designing such an architecture that provides for limited cross-talk between the plurality of qubits; and/or designing such an architecture that provides for limited unintended energy loss to surrounding components (i.e., unintentional loss of electrical energy transferred to surrounding components).

Existing quantum surface code architectures attempt to overcome one or more of the challenges listed above; however, such prior art architectures fail to do so, or they create design tradeoffs, manufacturing tradeoffs, and/or other problems such as limited computation or information processing capacity, lack of performance reliability, and/or excessive power consumption. For example, some prior art architectures employ a planar approach, where planar readout resonators are utilized to address qubits located on the same plane as the planar readout resonators. A problem with such planar-based prior art architectures is that they offer limited computation and/or information processing capacity, as such architectures are limited to a substantially low number of qubits (at present, only eight (8) qubits) that can be addressed by the planar readout resonators (e.g., such planar architectures do not allow for addressing qubits inside a lattice surface code architecture comprising an indefinite quantity of qubits). Other problems associated with such prior art planar-based architectures is that they enable inadvertent cross-talk between the qubits and enable undesired loss of electrical energy (e.g., dielectric loss) to components adjacent to the qubits.

To overcome some of the challenges associated with planar-based quantum surface code architectures, some prior art architectures employ a vertical approach, where qubits are addressed in a vertical manner (i.e., the qubits and the readout resonators are located on different planes). A problem associated with some vertical-based prior art architectures is that they create electrical coupling variations between the qubit and the readout resonators (i.e., the capacitive coupling necessary to address the qubit is not consistent). Another problem associated with some vertical-based prior art architectures is that they are difficult to fabricate on a semiconductor device, resulting in manufacturing defects (e.g., component alignment issues) and/or device malfunction. Another problem associated with some vertical-based prior art architectures is that they do not provide for one or more components necessary for scalable qubit devices having a plurality of qubits (e.g., cross resonance gates). Another problem associated with some vertical-based prior art architectures is that they are structurally and/or functionally complex, requiring excessive components and operations to address the qubits (e.g., bump bonds, more than two (2) semiconductor substrate layers, excessive Through-Silicon Vias (TSVs) to electrically connect such multiple layers, etc.).

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatus and/or computer program products that facilitate vertical dispersive readout of qubits of a lattice surface code architecture are described.

According to an embodiment, a device can comprise a first substrate that can have a first side and a second side that can be opposite the first side. The first substrate can comprise a read pad that can be located on the first side and a readout resonator that can be located on the second side. The device can further comprise a second substrate that can be connected to the first substrate. The second substrate can comprise a qubit. An advantage of such a device is that it can facilitate realization of a scalable vertical quantum computing lattice surface code architecture that can comprise an indefinite quantity of qubits that can be addressed by a processor employing the device to execute complex computation and information processing functions. Another advantage of such a device is that it can employ fewer and less complex components that can be easily fabricated using one or more techniques for fabricating an integrated circuit.

In some embodiments, the device can further comprise a recess that can be located on the first side of the first substrate. The recess can comprise the read pad. An advantage of such a device is that it can facilitate improved capacitive coupling between the read pad and the qubit. Another advantage of such a device is that it can facilitate reduced cross-talk between the qubit and one or more second qubits. Another advantage of such a device is that it can facilitate reduced loss of an electric field output by the qubit.

In another embodiment, a method can comprise connecting a read pad to a first side of a first substrate and connecting a readout resonator to a second side of the first substrate. The second side can be opposite the first side. The method can further comprise connecting a qubit to a first side of a second substrate. The method can also comprise connecting the second substrate to the first substrate. An advantage of such a method is that it can be employed to fabricate a scalable vertical readout device that can comprise an indefinite quantity of qubits that can be addressed to execute complex computation and information processing functions. Another advantage of such a method is that it can be used to fabricate a scalable vertical readout device that can comprise fewer and less complex components that can be easily fabricated using one or more techniques for fabricating an integrated circuit.

In some embodiments, the method can further comprise forming a recess on the first side of the first substrate. The method can further comprise placing the read pad inside the recess. An advantage of such a method is that it can be employed to fabricate a scalable vertical readout device that can facilitate improved capacitive coupling between the read pad and the qubit. Another advantage of such a method is that it can be employed to fabricate a scalable vertical readout device that can facilitate reduced cross-talk between the qubit and one or more second qubits. Another advantage of such a method is that it can be employed to fabricate a scalable vertical readout device that can facilitate reduced loss of an electric field output by the qubit.

In another embodiment, a device can comprise a first dielectric substrate that can comprise a recess, a readout resonator, and a read pad that can be located within the recess. The device can further comprise a second dielectric substrate that can be connected to the first dielectric substrate. The second dielectric substrate can comprise a qubit.

An advantage of such a device is that it can facilitate realization of a scalable vertical quantum computing lattice surface code architecture that can comprise an indefinite quantity of qubits that can be addressed by a processor employing the device to execute complex computation and information processing functions. Another advantage of such a device is that it can employ fewer and less complex components that can be easily fabricated using one or more techniques for fabricating an integrated circuit. Another advantage of such a device is that it can facilitate improved capacitive coupling between the read pad and the qubit. Another advantage of such a device is that it can facilitate reduced cross-talk between the qubit and one or more second qubits. Another advantage of such a device is that it can facilitate reduced loss of an electric field output by the qubit.

In another embodiment, a method can comprise forming a recess on a first dielectric substrate. The method can further comprise placing a read pad within the recess and placing a readout resonator on the first dielectric substrate. The method can further comprise connecting a qubit to a second dielectric substrate.

An advantage of such a method is that it can be employed to fabricate a scalable vertical readout device that can comprise an indefinite quantity of qubits that can be addressed to execute complex computation and information processing functions. Another advantage of such a method is that it can be employed to fabricate a scalable vertical readout device that can comprise fewer and less complex components that can be easily fabricated using one or more techniques for fabricating an integrated circuit. Another advantage of such a method is that it can be employed to fabricate a scalable vertical readout device that can facilitate improved capacitive coupling between the read pad and the qubit. Another advantage of such a method is that it can be employed to fabricate a scalable vertical readout device that can facilitate reduced cross-talk between the qubit and one or more second qubits. Another advantage of such a method is that it can be employed to fabricate a scalable vertical readout device that can facilitate reduced loss of an electric field output by the qubit.

In another embodiment, a device can comprise a first substrate that can comprise a plurality of vias that can electrically connect readout resonators that can be located on a first side of the first substrate to respective read pads that can be located on a second side of the first substrate. The first side of the first substrate can be opposite the second side of the first substrate. The device can further comprise a second substrate, that can be connected to the first substrate, and can comprise a plurality of qubits that can be electrically coupled to respective transmission line resonators that can be located on the second substrate.

An advantage of such a device is that it can facilitate realization of a scalable vertical quantum computing lattice surface code architecture that can comprise an indefinite quantity of qubits that can be addressed by a processor employing the device to execute complex computation and information processing functions. Another advantage of such a device is that it can employ fewer and less complex components that can be easily fabricated using one or more techniques for fabricating an integrated circuit. Another advantage of such a device is that it can facilitate improved capacitive coupling between the read pad and the qubit. Another advantage of such a device is that it can facilitate reduced cross-talk between the qubit and one or more second qubits. Another advantage of such a device is that it can facilitate reduced loss of an electric field output by the qubit.

DESCRIPTION OF THE DRAWINGS

FIG. 6A illustrates non-limiting example information of simulated qubit frequency in accordance with one or more embodiments of the disclosed subject matter.

FIG. 6B illustrates non-limiting example information of simulated capacitive coupling between readout pad and qubit in a two-dimensional (2D) approach and a vertical three-dimensional (3D) solution in accordance with one or more embodiments of the disclosed subject matter.

DETAILED DESCRIPTION

Figure 1:
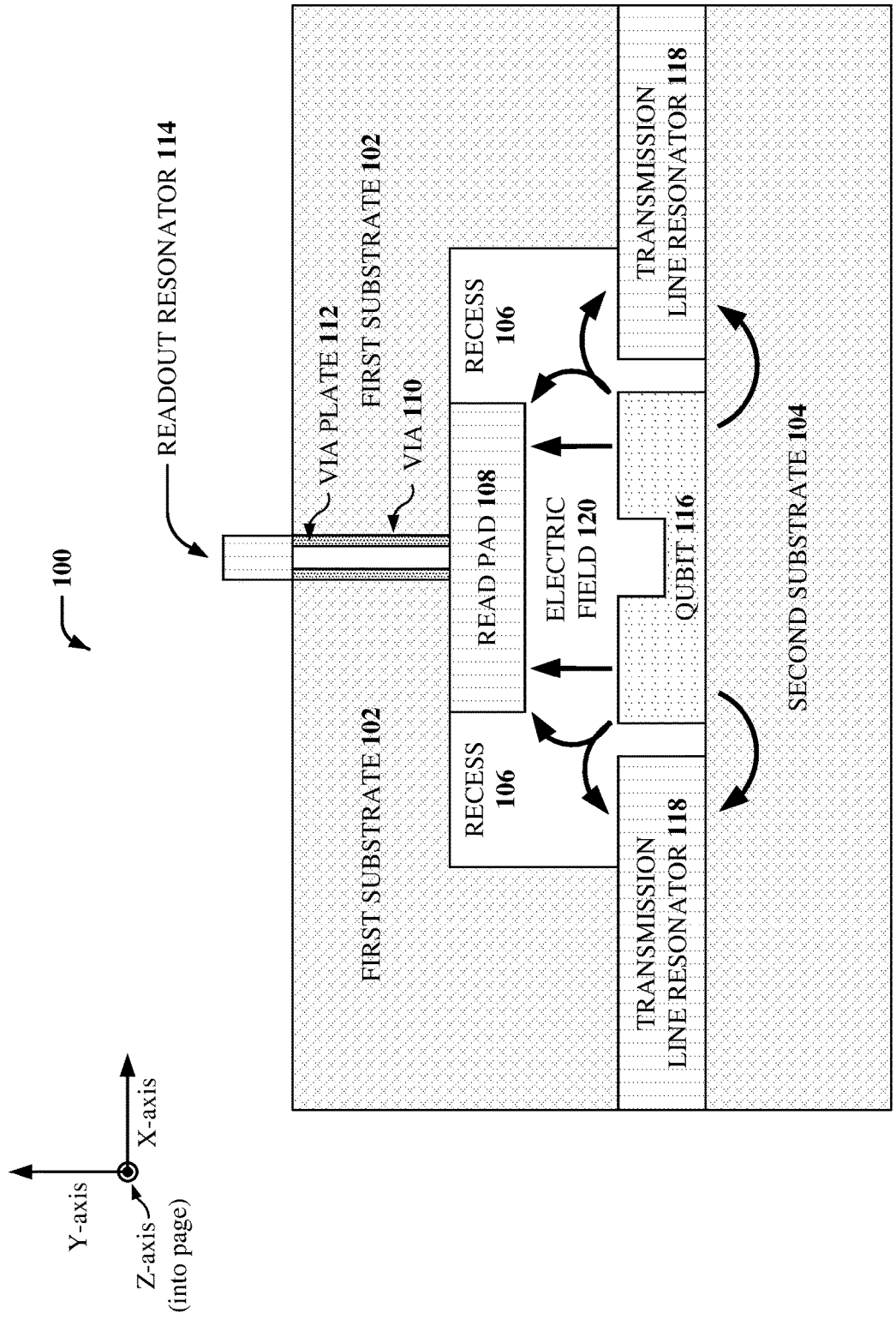
FIG. 1 illustrates a cross-sectional side view of an example, non-limiting vertical readout device that facilitates vertical dispersive readout of qubits of a lattice surface code architecture in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Given the above problem with existing planar-based quantum surface code architectures having limited computation and/or information processing capacity due to their inability to address qubits of a lattice surface code architecture, the present disclosure can be implemented to produce a solution to this problem in the form of a scalable vertical-based quantum computing lattice surface code architecture comprising an indefinite quantity of qubits on one substrate that can be dispersively addressed by resonant buses located on another substrate. In addition, given the above problem with existing planar-based quantum surface code architectures that enable inadvertent cross-talk between the qubits and enable undesired loss of electrical energy to components adjacent to the qubits, the present disclosure can be implemented to produce a solution to this problem in the form of a vertical readout device that can facilitate dissipation of an electric field output by a qubit into air and/or a vacuum of a recess of such vertical readout device, which reduces cross-talk and electrical energy loss.

Further, given the above problem with existing vertical-based quantum surface code architectures that create electrical coupling variations between the qubit and the readout resonators, the present disclosure can be implemented to produce a solution to this problem in the form of a vertical readout device comprising a recess having a read pad that capacitively couples to a qubit located opposite to the read pad, where the dimensions of the recess can be varied to enable an optimized capacitive coupling between the read pad and the qubit. Moreover, given the above problem with existing vertical-based quantum surface code architectures that are structurally and/or functionally complex and difficult to fabricate on a semiconductor device, resulting in manufacturing defects and/or device malfunction, the present disclosure can be implemented to produce a solution to this problem in the form of a vertical readout device that can employ fewer and less complex components that can be easily fabricated using one or more techniques for fabricating an integrated circuit.

An advantage of such a device described herein is that it can facilitate realization of a scalable vertical quantum computing lattice surface code architecture that can comprise an indefinite quantity of qubits that can be addressed by a processor employing the device to execute complex computation and information processing functions. Another advantage of such a device is that it can facilitate reduced cross-talk between the qubit and one or more second qubits. Another advantage of such a device is that it can facilitate reduced loss of an electric field output by the qubit. Another advantage of such a device is that it can facilitate optimized capacitive coupling between the read pad and the qubit. Another advantage of such a device is that it can employ fewer and less complex components that can be easily fabricated using one or more techniques for fabricating an integrated circuit.

FIG. 1 illustrates a cross-sectional side view of an example, non-limiting vertical readout device 100 that facilitates vertical dispersive readout of qubits of a lattice surface code architecture in accordance with one or more embodiments described herein. According to several embodiments, vertical readout device 100 can comprise a first substrate 102, a second substrate 104, a recess 106, a read pad 108, one or more readout resonators 114, a qubit 116, and/or one or more transmission line resonators 118.

According to multiple embodiments, vertical readout device 100 and/or the components associated therewith (e.g., first substrate 102, second substrate 104, recess 106, read pad 108, via 110, via plate 112, readout resonators 114, qubit 116, transmission line resonators 118, etc.) can be indicative of a superconducting quantum circuit that can be fabricated in a semiconductor device utilizing one or more techniques for fabricating an integrated circuit. As referenced herein, an integrated circuit can comprise various electronic-based systems, devices, components, and/or circuits that are mechanically supported by one or more layers of substrate material and electrically connected or coupled by conductive tracks, pads, and/or other features etched into one or more such substrate layers.

According to various embodiments of the subject disclosure described herein and/or illustrated in the figures (e.g., vertical readout device 100), fabrication of such embodiments can comprise a multi-step sequence of, for example, photolithographic and/or chemical processing steps that facilitate gradual creation of electronic-based systems, devices, components, and/or circuits on one or more substrate layers. For instance, vertical readout device 100, and/or other embodiments described herein, can be fabricated by employing techniques including, but not limited to: photolithography, microlithography, nanolithography, nanoimprint lithography, photomasking techniques, patterning techniques, photoresist techniques, etching techniques (e.g., reactive ion etching (RIE), dry etching, wet etching, etc.), sputtering techniques, plasma ashing techniques, thermal treatments (e.g., rapid thermal anneal, furnace anneals, thermal oxidation, etc.), chemical vapor deposition (CVD), physical vapor deposition (PVD), molecular beam epitaxy (MBE), electrochemical deposition (ECD), chemical-mechanical planarization (CMP), backgrinding techniques, and/or another technique for fabricating an integrated circuit.

According to various embodiments of the subject disclosure described herein and/or illustrated in the figures (e.g., vertical readout device 100), such embodiments can be fabricated (e.g., as described above) using various materials. For example, vertical readout device 100, and/or other embodiments described herein, can be fabricated using materials of one or more different material classes including, but not limited to: conductive materials, semiconductor materials, superconducting materials, dielectric materials, polymer materials, organic materials, inorganic materials, non-conductive materials, and/or another material that can be utilized with one or more of the techniques described above for fabricating an integrated circuit.

According to multiple embodiments, first substrate 102 can comprise a first side and a second side that can be opposite the first side. For example, first substrate 102 can comprise a "bottom" side and a "top" side that can be opposite the "bottom" side. In some embodiments, first substrate 102 can comprise read pad 108 that can be located on the first side of first substrate 102 and one or more readout resonators 114 that can be located on the second side of first substrate 102. For example, first substrate 102 can comprise read pad 108 that can be located on the "bottom" side of first substrate 102 and one or more readout resonators 114 that can be located on the "top" side of first substrate 102.

In several embodiments, second substrate 104 can comprise a first side (e.g., a "top" side) that can be connected to or overlap the first side (e.g., "bottom" side) of first substrate 102. For example, second substrate 104 can comprise a "top" side that can be connected to or overlap the "bottom" side of first substrate 102. In some embodiments, second substrate 104 can comprise qubit 116 that can be located on the first side of second substrate 104. For example, second substrate 104 can comprise qubit 116 that can be located on the "top" side of second substrate 104.

According to multiple embodiments, first substrate 102 and/or second substrate 104 can comprise a semiconductor material. For instance, first substrate 102 and/or second substrate 104 can comprise a dielectric material. As referenced herein, dielectric material can be defined as an electrically insulating material that can be polarized by an applied electric field such that positive atomic electrical charges of the material are displaced in the direction of the applied electric field and negative charges shift in the opposite direction. For example, first substrate 102 and/or second substrate 104 can comprise various dielectric materials including, but not limited to, sapphire (e.g., aluminum oxide ($Al_2O_3$)), silicon (Si), and/or another dielectric material.

In several embodiments, first substrate 102 and/or second substrate 104 can comprise various low loss dielectric materials (e.g., dielectric materials having low inherent dissipation of electromagnetic energy). For example, first substrate 102 and/or second substrate 104 can comprise low loss dielectric materials having low loss angle δ or corresponding loss tangent angle δ (e.g., tan $δ<<1e^{-5}$). For instance, first substrate 102 and/or second substrate 104 can comprise various low loss dielectric materials such as, for example, sapphire (e.g., aluminum oxide ($Al_2O_3$)).

In some embodiments, first substrate 102 and/or second substrate 104 can comprise any thickness (i.e., height, as measured along the Y-axis of FIG. 1) that ensures mechanical stability of such components. In a non-limiting embodiment, first substrate 102 and/or second substrate 104 can be ground (e.g., via backgrinding) to a thickness (i.e., height) of 735 micrometers (μm).

According to multiple embodiments, first substrate 102 can comprise recess 106 located on a first side of first substrate 102. For example, recess 106 can be formed on the "bottom" side of first substrate 102 by: applying a photomask and photoresist to the "bottom" side of first substrate 102 such that the desired geometric two-dimensional (2D) shape of recess 106 can be etched into the "bottom" side of first substrate 102; and etching the "bottom" side of first substrate 102 (e.g., via RIE) such that the desired geometric 2D shape of recess 106 is etched into the "bottom" side of first substrate 102 to a desired depth (i.e., height, as measured along the Y-axis of FIG. 1), for instance, as illustrated in FIG. 1.

In several embodiments, recess 106 can comprise a variety of shapes. For instance, the shape of recess 106 can be defined in the 2D plane extending along the X-axis and Z-axis of FIG. 1, which can be observed in a top view of vertical readout device 100 (e.g., as presented in FIG. 4). In some embodiments, recess 106 can be etched into first substrate 102 in such a manner to form shapes including, but not limited to, a circle, a square, a rectangle, a hexagon, an octagon, a diamond, and/or another shape that can be defined in such a 2D plane extending along the X-axis and Z-axis of FIG. 1.

In several embodiments, recess 106 can comprise a variety of dimensions. For instance, the width (i.e., X-axis of FIG. 1), the depth (i.e., Y-axis of FIG. 1), and/or the length (i.e., Z-axis of FIG. 1) of recess 106 can be fabricated to certain respective dimensions to enable optimized functionality of vertical readout device 100 and/or one or more components of vertical readout device 100 (e.g., to enable optimized capacitive coupling between read pad 108 and qubit 116, as described below). For example, in some embodiments, recess 106 can be etched into first substrate 102 in such a manner to form a rectangle shape in the 2D plane extending along the X-axis and Z-axis of FIG. 1, where the depth (i.e., Y-axis of FIG. 1) of recess 106 can correspond to a dimension that enables optimized capacitive coupling between read pad 108 and qubit 116. For instance, the depth of recess 106 can range from 10 μm to 1 millimeter (mm).

In some embodiments, the capacitive coupling between read pad 108 and qubit 116 can be based on a 1-to-1 (linear) relationship with the distance between read pad 108 and qubit 116, and thus, can be based on the depth of recess 106. For example, for a certain fixed width (i.e., X-axis of FIG. 1) and length (i.e., Z-axis of FIG. 1) of recess 106, capacitive coupling between read pad 108 and qubit 116 can range from approximately 1 femtofarad (fF) to approximately 1 picofarad (pF). In a non-limiting example embodiment, capacitive coupling between read pad 108 and qubit 116 can range from approximately 4 fF to 5 fF.

In several embodiments, read pad 108 can be deposited on a first side of first substrate 102. For instance, read pad 108 can be deposited on a first side (e.g., the "bottom" side) of first substrate 102. In some embodiments, recess 106 can comprise read pad 108. For example, read pad 108 can be deposited on a side (e.g., the "ceiling") of recess 106. In some embodiments, read pad 108 can be deposited on the "ceiling" of recess 106 by: filling recess 106 with superconducting material (e.g., via CVD, PVD, MBE, ECD, etc.); backgrinding such superconducting material such that the surface of the superconducting material is level (i.e., flush) with the "bottom" side of first substrate 102; applying a photomask and photoresist to the "bottom" side of first substrate 102 and/or the superconducting material such that the desired geometric 2D shape of read pad 108 can formed on the "ceiling" of recess 106; and etching the superconducting material (e.g., via RIE) such that the remaining material constitutes read pad 108 positioned on the "ceiling" of recess 106 (e.g., as illustrated in FIG. 1).

In some embodiments, read pad 108 can be deposited (e.g., as described above) on a first side of first substrate 102 or a side of recess 106 in such a manner that read pad 108 is positioned opposite from qubit 116. For example, read pad 108 can be deposited on the "ceiling" of recess 106 such that read pad 108 is positioned above qubit 116 (i.e., opposite from qubit 116), for instance, as illustrated in the embodiment depicted in FIG. 1. In some embodiments, read pad 108 can be axially aligned with qubit 116 along an axis perpendicular to a first side of second substrate 104. For example, read pad 108 can be axially aligned with qubit 116 along an axis perpendicular to a "top" side of second substrate 104, for instance, as illustrated in the embodiment depicted in FIG. 1.

According to multiple embodiments, read pad 108 can comprise a superconducting material. As referenced herein, a superconducting material can comprise a material that can exhibit zero electrical resistance and expulsion of magnetic flux fields when cooled below a characteristic critical temperature (i.e., the temperature at which such superconductivity characteristics appear for a certain material). For example, read pad 108 can comprise a superconducting material including, but not limited to, aluminum (Al), niobium (Nb), niobium nitride (NbN), titanium (Ti), titanium nitride (TiN), tantalum (Ta), and/or another superconducting material. In such an example, the corresponding characteristic critical temperatures of the respective example superconducting materials listed above can be as follows: Al (1.20 Kelvin (K)); Nb (9.26 K); NbN (16.00 K); Ti (0.39 K); TiN (5.60 K); and/or Ta (4.48 K).

In several embodiments, read pad 108 can comprise a variety of shapes. For example, the shape of read pad 108 can be defined in the 2D plane extending along the X-axis and Z-axis of FIG. 1 (e.g., as described above). In some embodiments, read pad 108 can be deposited on first substrate 102 or recess 106 in such a manner to form shapes including, but not limited to, a circle, a square, a rectangle, a hexagon, an octagon, a diamond, and/or another shape that can be defined in such a 2D plane extending along the X-axis and Z-axis of FIG. 1.

In some embodiments, read pad 108 can comprise a variety of dimensions. For instance, the width (i.e., X-axis of FIG. 1), the thickness (i.e., Y-axis of FIG. 1), and/or the length (i.e., Z-axis of FIG. 1) of read pad 108 can be fabricated to certain respective dimensions to enable optimized functionality of vertical readout device 100 and/or one or more components of vertical readout device 100 (e.g., to enable optimized capacitive coupling between read pad 108 and qubit 116). For example, read pad 108 can be deposited on first substrate 102 or recess 106 in such a manner to form a square shape in the 2D plane extending along the X-axis and Z-axis of FIG. 1. In a non-limiting example embodiment, read pad 108 can comprise a thickness of less than 1 μm.

According to multiple embodiments, first substrate 102 can comprise via 110 that can electrically connect readout resonator 114 to read pad 108. As referenced herein, a via (also known as "vertical interconnect access") can be defined as an opening through a layer of material in a physical electronic circuit, through which an electrical connection between two other adjacent material layers can be formed (e.g., in integrated circuits, such a via is often referred to as a "through-silicon via" (TSV) or a "through-chip via"). In some embodiments, via 110 can be formed in first substrate 102 to establish an electrical connection between read pad 108 and readout resonator 114.

In several embodiments, via 110 can be formed in first substrate 102 by etching into first substrate 102. For instance, etch lithography can be employed to etch via 110. For example, via 110 can be etched into first substrate 102 by: applying a photomask and photoresist to the "top" side of first substrate 102 such that the desired geometric 2D shape of via 110 can be etched into first substrate 102; and etching the first substrate 102 (e.g., via RIE) such that via 110 is formed in first substrate 102 (e.g., as illustrated in FIG. 1).

In some embodiments, via 110 can comprise a variety of shapes. For instance, the shape of via 110 can be defined in the 2D plane extending along the X-axis and Z-axis of FIG. 1 (e.g., as described above). In some embodiments, via 110 can be etched into first substrate 102 in such a manner to form shapes including, but not limited to, a circle, a square, a rectangle, a hexagon, an octagon, a diamond, and/or another shape that can be defined in such a 2D plane extending along the X-axis and Z-axis of FIG. 1.

In some embodiments, via 110 can comprise a variety of dimensions. For instance, the width (i.e., X-axis of FIG. 1), the height (i.e., Y-axis of FIG. 1), and/or the depth (i.e., Z-axis of FIG. 1) of via 110 can be fabricated to certain respective dimensions to enable optimized functionality of vertical readout device 100 and/or one or more components of vertical readout device 100 (e.g., to enable optimized electrical connection between read pad 108 and readout resonator 114). For example, in some embodiments, via 110 can be etched into first substrate 102 in such a manner to form a circular shape in the 2D plane extending along the X-axis and Z-axis of FIG. 1. In some embodiments, via 110 can comprise a diameter that is smaller than the width (i.e., X-axis of FIG. 1) and/or the length (i.e., Z-axis of FIG. 1) of read pad 108. In another example, via 110 can comprise a height (i.e., Y-axis of FIG. 1) that is less than one-tenth (1/10) the wavelength of an electromagnetic radiation wave output by qubit 116 (e.g., represented as electric field 120 in FIG. 1). For instance, via 110 can comprise a height $<<\lambda_{qbt}/10$. In a non-limiting example embodiment, at a certain frequency (e.g., 5 gigahertz (GHz)), the wavelength of an electromagnetic radiation wave output by qubit 116 can be approximately 6 centimeters (cm), and therefore, according to this example, via 110 can comprise a height of approximately 6 mm.

According to multiple embodiments, via 110 can comprise a via plate 112. For example, via plate 112 can comprise a thin-film conductive material that lines the inside surface of via 110, thereby enabling electrical connection between read pad 108 and readout resonator 114. In some embodiments, via plate 112 can comprise a thin-film superconductive material (e.g., Al, Nb, NbN, Ti, TiN, Ta, etc.) that lines the inside surface of via 110. In some embodiments, via plate 112 can comprise a thin-film material comprising any thickness (e.g., as measured along the X-axis of FIG. 1) that can enable an electrical connection between read pad 108 and readout resonator 114. In some embodiments, via plate 112 can comprise other thin-film conductive materials such as, for example, a tube or a rivet, either of which can be inserted into via 110 to enable an electrical connection between read pad 108 and readout resonator 114.

In some embodiments, via plate 112 can be deposited on the inside surface of via 110 by employing material deposition techniques and photolithography techniques described above. For example, via plate 112 can be deposited on the inside surface of via 110 by: filling via 110 with superconducting material (e.g., via CVD, PVD, MBE, ECD, etc.); backgrinding such superconducting material such that the surface of the superconducting material is level (i.e., flush) with the "top" side of first substrate 102; applying a photomask and photoresist to the "top" side of first substrate 102 and/or the superconducting material such that the desired geometric 2D shape of via plate 112 can be formed on the inside surface of via 110; and etching the superconducting material (e.g., via RIE) such that the remaining material constitutes via plate 112 positioned on the inside surface of via 110 (e.g., as illustrated in FIG. 1).

In several embodiments, readout resonator 114 can be located on a second side of first substrate 102. For instance, according to the embodiment illustrated in FIG. 1, readout resonator 114 can be located on the "top" side of first substrate 102. In some embodiments, readout resonator 114 can be deposited on the "top" side of first substrate 102 by employing material deposition techniques and photolithography techniques described above. For example, readout resonator 114 can be deposited on the "top" side of first substrate 102 by: depositing superconducting material on the "top" side of first substrate 102 (e.g., via CVD, PVD, MBE, ECD, etc.); backgrinding such superconducting material to a desired height (e.g., measured along the Y-axis of FIG. 1); applying a photomask and photoresist to the "top" side of first substrate 102 and/or the superconducting material such that the desired geometric 2D shape of readout resonator 114 can be formed on the "top" side of first substrate 102; and etching the superconducting material (e.g., via RIE) such that the remaining material constitutes readout resonator 114 positioned on the "top" side of first substrate 102 (e.g., as illustrated in FIG. 1).

In some embodiments, readout resonator 114 can be embedded in a second side of first substrate 102. For example, readout resonator 114 can be embedded in the "top" side of first substrate 102 by employing photolithography techniques to form one or more cavities (i.e., recesses) and/or channels in the "top" side of first substrate 102 and utilizing material deposition techniques to deposit superconducting material into such cavities and/or channels to form readout resonator 114. For instance, readout resonator 114 can be embedded in the "top" side of first substrate 102 by: applying a photomask and photoresist to the "top" side of first substrate 102 such that the desired geometric 2D shape of readout resonator 114 can be etched into the "top" side of first substrate 102; etching (e.g., via RIE) the desired geometric 2D shape of readout resonator 114 into the "top" side of first substrate 102; filling the etched portions on the "top" side of first substrate 102 with superconducting material (e.g., via CVD, PVD, MBE, ECD, etc.); and backgrinding such superconducting material to a desired height (e.g., measured along the Y-axis of FIG. 1) to form readout resonator 114 embedded in the "top" side of first substrate 102 (e.g., as illustrated in FIG. 1).

According to multiple embodiments, readout resonator 114 can comprise a superconducting material. For example, readout resonator 114 can comprise a superconducting material including, but not limited to, Al, Nb, NbN, Ti, TiN, Ta, and/or another superconducting material.

In multiple embodiments, readout resonator 114 can comprise a variety of dimensions that can enable a desired frequency of operation of vertical readout device 100. For instance, readout resonator 114 can be deposited on or embedded in, as described above, a second side (e.g., the "top" side) of first substrate 102 in such a manner to form readout resonator 114 comprising dimensions that can enable a desired frequency of operation of vertical readout device 100.

In several embodiments, readout resonator 114 can be deposited on or embedded in, as described above, a second side (e.g., the "top" side) of first substrate 102 in such a manner to enable electrical connection of readout resonator 114 to read pad 108. For example, readout resonator 114 can be deposited on or embedded in the "top" side of first substrate 102 in such a manner to enable electrical connection (e.g., through via 110) of readout resonator 114 to read pad 108. In another example, readout resonator 114 can be deposited on or embedded in the "top" side of first substrate 102 in such a manner to enable electrical connection (e.g., through via plate 112) of readout resonator 114 to read pad 108.

In several embodiments, readout resonator 114 can comprise a resonator having a resonance frequency that can facilitate reading (i.e., addressing) qubit 116. For instance, readout resonator 114 can comprise a microwave readout resonator (e.g., microwave resonator, resonant bus, etc.) in which microwave signals can be input to activate qubit 116 and read (i.e., address) a qubit state of qubit 116 (e.g., a qubit logical state of qubit 116). For example, readout resonator 114 can be electrically coupled (e.g., capacitively coupled, conductively connected, etc.) to input circuitry and/or output circuitry of vertical readout device 100 (not illustrated in FIG. 1) that can facilitate input of such microwave signals to readout resonator 114. In some embodiments, readout resonator 114 can be electrically coupled to input circuitry and/or output circuitry of vertical readout device 100 that electrically couples vertical readout device 100 to an outside electrical environment. For example, readout resonator 114 can be electrically coupled to input circuitry and/or output circuitry of vertical readout device 100 that electrically couples vertical readout device 100 to a 50 ohm (Ω) environment.

In some embodiments, readout resonator 114 can dispersively read (i.e., dispersively address) qubit 116. For example, readout resonator 114 can dispersively read qubit 116 by capacitively probing qubit 116 to read (i.e. address) one or more qubit logical states of qubit 116 (e.g., quantum states of qubit 116). For instance, as described above, readout resonator 114 can be electrically connected to via plate 112, and via plate 112 can be electrically connected to read pad 108. In this example, read pad 108 can be capacitively coupled to qubit 116, thereby facilitating capacitive probing (i.e., dispersive readout) of qubit 116 by readout resonator 114. In other example, readout resonator 114 can be electrically connected to read pad 108 through via 110 (e.g., as described above), and read pad 108 can be capacitively coupled to qubit 116, thereby facilitating capacitive probing (i.e., dispersive readout) of qubit 116 by readout resonator 114.

In several embodiments, qubit 116 can be located on a first side of second substrate 104. For example, according to the embodiment illustrated in FIG. 1, qubit 116 can be located on a "top" side of second substrate 104. In some embodiments, qubit 116 can be deposited on the "top" side of second substrate 104 by employing photolithography techniques and material deposition techniques described above. For example, qubit 116 can be deposited on the "top" side of second substrate 104 by: depositing the qubit materials (e.g., superconducting material, non-superconducting material, etc.) on the "top" side of second substrate 104 (e.g., via CVD, PVD, MBE, ECD, etc.); backgrinding such qubit materials to one or more desired heights (e.g., measured along the Y-axis of FIG. 1); applying a photomask and photoresist to the "top" side of second substrate 104 and/or the qubit materials such that the desired geometric 2D shape of qubit 116 can be formed on the "top" side of second substrate 104; and etching the qubit materials (e.g., via RIE) such that the remaining material constitutes qubit 116 positioned on the "top" side of second substrate 104 (e.g., as illustrated in FIG. 1).

In some embodiments, qubit 116 can be embedded in a first side of second substrate 104. For example, qubit 116 can be embedded in the "top" side of second substrate 104 by employing photolithography techniques to form one or more cavities (i.e., recesses) and/or channels in the "top" side of second substrate 104 and utilizing material deposition techniques to deposit qubit materials (e.g., superconducting material, non-superconducting material, etc.) into such cavities and/or channels to form qubit 116. For instance, qubit 116 can be embedded in the "top" side of second substrate 104 by: applying a photomask and photoresist to the "top" side of second substrate 104 such that the desired geometric 2D shape of qubit 116 can be etched into the "top" side of second substrate 104; etching (e.g., via RIE) the desired geometric 2D shape of qubit 116 into the "top" side of second substrate 104; filling the etched portions on the "top" side of second substrate 104 (e.g., via CVD, PVD, MBE, ECD, etc.) with desired qubit materials (e.g., superconducting material, non-superconducting material, etc.); and backgrinding such qubit materials to a desired height (e.g., measured along the Y-axis of FIG. 1) to form qubit 116 embedded in the "top" side of second substrate 104 (e.g., as illustrated in FIG. 1).

In several embodiments, qubit 116 can be deposited on or embedded in, as described above, a first side (e.g., the "top" side) of second substrate 104 in such a manner to enable electrically coupling qubit 116 to read pad 108. For example, qubit 116 can be deposited on or embedded in the "top" side of second substrate 104 in such a manner to enable capacitively coupling qubit 116 to read pad 108, where such capacitive coupling can be represented as electric field 120 in FIG. 1. For instance, to facilitate electrically coupling qubit 116 to read pad 108, qubit 116 can be deposited on or embedded in, as described above, a first side (e.g., the "top" side) of second substrate 104 in such a manner to position qubit 116 below read pad 108 (i.e., opposite from read pad 108), for example, as illustrated in the embodiment depicted in FIG. 1.

According to multiple embodiments, qubit 116 can comprise various types of qubits. For instance, qubit 116 can comprise a qubit such as, for example, a transmon qubit, a planar qubit, a charge qubit, a flux qubit, a phase qubit, a vertical qubit, and/or another type of qubit. In some embodiments, qubit 116 can comprise a qubit having a Josephson junction. For example, qubit 116 can comprise a transmon qubit having a Josephson junction. As referenced herein, a Josephson junction can comprise a superconducting component that manifest the Josephson effect of a supercurrent, where current can flow indefinitely across a Josephson junction without an applied voltage. For example, a Josephson junction can be created by weakly coupling (e.g., communicatively, electrically, etc.) two (2) superconductors (i.e., capacitive pads) using a tunnel barrier (or tunnel layer) that can comprise a non-superconducting, non-conductive material such as, for example, aluminum oxide ($Al_2O_3$).

In some embodiments, qubit 116 can comprise quantum information. As referenced herein, quantum information can comprise information associated with a quantum state of an isolated quantum system (e.g., qubit 116), where the quantum state provides a probability distribution for the value of respective dynamic variables measured on the system (i.e., the probable outcome of respective variables measured on the system). In some embodiments, readout resonator 114 can dispersively read (e.g., via capacitive coupling, as described above) such quantum information.

In multiple embodiments, qubit 116 can comprise a variety of dimensions. For example, qubit 116 can comprise a transmon qubit comprising two (2) superconducting capacitive pads weakly coupled to one another by a non-superconducting, non-conductive tunnel barrier (or tunnel layer). In this example, qubit 116 can be deposited on or embedded in, as described above, a first side (e.g., the "top" side) of second substrate 104 in such a manner to form capacitive pads respectively comprising any dimension that can enable such a transmon qubit. Additionally, or alternatively, in such an example, qubit 116 can be deposited on or embedded in, as described above, a first side (e.g., the "top" side) of second substrate 104 in such a manner to form a tunnel barrier comprising any dimension that can enable such a transmon qubit.

In several embodiments, one or more transmission line resonators 118 can be located on a first side of second substrate 104. For example, according to the embodiment illustrated in FIG. 1, one or more transmission line resonators 118 can be located on a "top" side of second substrate 104. In some embodiments, transmission line resonators 118 can be deposited on the "top" side of second substrate 104 by employing material deposition techniques and photolithography techniques described above. For example, transmission line resonators 118 can be deposited on the "top"

side of second substrate 104 by: depositing superconducting material on the "top" side of second substrate 104 (e.g., via CVD, PVD, MBE, ECD, etc.); backgrinding such superconducting material to a desired height (e.g., measured along the Y-axis of FIG. 1); applying a photomask and photoresist to the "top" side of second substrate 104 and/or the superconducting material such that the desired geometric 2D shape of transmission line resonators 118 can be formed on the "top" side of second substrate 104; and etching the superconducting material (e.g., via RIE) such that the remaining material constitutes transmission line resonators 118 positioned on the "top" side of second substrate 104 (e.g., as illustrated in FIG. 1).

In some embodiments, one or more transmission line resonators 118 can be embedded in a first side of second substrate 104. For example, transmission line resonators 118 can be embedded in the "top" side of second substrate 104 by employing photolithography techniques to form one or more cavities (i.e., recesses) and/or channels in the "top" side of first substrate 102 and utilizing material deposition techniques to deposit superconducting material into such cavities and/or channels to form readout resonators 114. For instance, transmission line resonators 118 can be embedded in the "top" side of second substrate 104 by: applying a photomask and photoresist to the "top" side of second substrate 104 such that the desired geometric 2D shape of transmission line resonators 118 can be etched into the "top" side of second substrate 104; etching (e.g., via RIE) the desired geometric 2D shape of transmission line resonators 118 into the "top" side of second substrate 104; filling the etched portions on the "top" side of second substrate 104 with superconducting material (e.g., via CVD, PVD, MBE, ECD, etc.); and backgrinding such superconducting material to a desired height (e.g., measured along the Y-axis of FIG. 1) to form transmission line resonators 118 embedded in the "top" side of second substrate 104 (e.g., as illustrated in FIG. 1).

In several embodiments, one or more transmission line resonators 118 can be deposited on or embedded in, as described above, a first side (e.g., the "top" side) of second substrate 104 in such a manner to enable electrically coupling transmission line resonators 118 to qubit 116. For example, transmission line resonators 118 can be deposited on or embedded in the "top" side of second substrate 104 in such a manner to enable capacitively coupling transmission line resonators 118 to qubit 116. For instance, transmission line resonators 118 can be deposited on or embedded in the "top" side of second substrate 104 in such a manner to allow for a gap between transmission line resonators 118 and qubit 116. In another example, transmission line resonators 118 can be deposited on or embedded in the "top" side of second substrate 104 in such a manner to enable conductively connecting transmission line resonators 118 to qubit 116. For instance, transmission line resonators 118 can be deposited on or embedded in the "top" side of second substrate 104 in such a manner to physically connect (e.g., mechanically and/or chemically) transmission line resonators 118 to qubit 116. As referenced herein, physically connecting can comprise mechanically and/or chemically connecting.

In some embodiments, transmission line resonators 118 can facilitate coupling qubit 116 to one or more other qubits not illustrated in FIG. 1 (e.g., one or more qubits that are different from qubit 116). For instance, transmission line resonators 118 can comprise resonant buses (also known as "resonant lines") that can facilitate coupling (e.g., communicatively, electrically, etc.) qubit 116 to one or more other qubits such that quantum information can be transferred between qubit 116 and such other qubits.

According to multiple embodiments, one or more transmission line resonators 118 can comprise a superconducting material. For example, transmission line resonators 118 can comprise a superconducting material including, but not limited to, Al, Nb, NbN, Ti, TiN, Ta, and/or another superconducting material.

In multiple embodiments, one or more transmission line resonators 118 can comprise a variety of dimensions that can enable a desired frequency of operation of vertical readout device 100. For instance, transmission line resonators 118 can be deposited on or embedded in, as described above, a first side (e.g., the "top" side) of second substrate 104 in such a manner to form transmission line resonators 118 respectively comprising dimensions that can enable a desired frequency of operation of vertical readout device 100.

According to multiple embodiments, first substrate 102 can be physically connected to second substrate 104. For example, first substrate 102 can be bonded (e.g., mechanically and/or chemically) to transmission line resonator 118 and/or second substrate 104 (e.g., in embodiments where transmission line resonator 118 is deposited in a channel etched into second substrate 104 as described above). For instance, first substrate 102 can be bonded to transmission line resonator 118 and/or second substrate 104 by employing a low-temperature annealing technique and/or another adhesion technique.

FIG. 1 illustrates a cross-sectional side view of an embodiment of vertical readout device 100 where first substrate 102 and second substrate 104 appear to be separated (i.e., not physically connected). However, in some embodiments, it should be appreciated that first substrate 102 and second substrate 104 can be physically connected (e.g., mechanically and/or chemically). For example, in some embodiments, transmission line resonators 118 can be deposited in a channel etched into second substrate 104 (e.g., as described above) and therefore, in such embodiments, first substrate 102 and second substrate 104 are physically connected (e.g., mechanically and/or chemically). In some embodiments, other components of vertical readout device 100 can be connected although such components appear to be separated in FIG. 1.

In some embodiments, it should be appreciated that an advantage of vertical readout device 100 is the use of limited components and ease of fabrication using one or more techniques for fabricating an integrated circuit. For example, vertical readout device 100 does not comprise components that require precise alignment and/or insertion into other components when physically connecting (e.g., mechanically and/or chemically) first substrate 102 and second substrate 104, which eliminates the possibility of component misalignment during fabrication that can result in device malfunction. In another example, vertical readout device 100 does not comprise more than two (2) substrate layers that respectively comprise one or more additional components (e.g., three (3) or more substrate layers electrically connected by TSV's). In still another example, vertical readout device 100 does not comprise bump bonds (e.g., indium bump bonds) to electrically connect one or more components of vertical readout device 100 (e.g., first substrate 102, second substrate 104, read pad 108, readout resonators 114, etc.).

In some embodiments, two or more components of vertical readout device 100 comprising material from the same material class (e.g., semiconducting material, superconducting material, etc.) can be the same type of material or different type of material. For example, first substrate 102 and second substrate 104 can comprise the same type of dielectric material (e.g., $Al_2O_3$). In another example, first substrate 102 can comprise one type of dielectric material (e.g., $Al_2O_3$) and second substrate 104 can comprise another type of dielectric material (e.g., Si). In still another example, read pad 108, via plate 112, readout resonator 114, qubit 116, and/or transmission line resonators 118 can comprise the same type of superconducting material (e.g., Nb). In yet another example, such components comprising superconducting material can respectively comprise different types of superconducting material (e.g., Al, Nb, NbN, Ti, TiN, Ta, etc.).

In some embodiments, some components of vertical readout device 100 can physically contact one another. For example, as illustrated in FIG. 1, readout resonator 114 can physically contact via plate 112, and via plate 112 can physically contact read pad 108. In some embodiments, components of vertical readout device 100 that can physically contact one another can comprise the same materials and can be deposited in a single step. In some embodiments, components of vertical readout device 100 that can physically contact one another can comprise different materials and can be deposited in separate steps.

Figure 2:
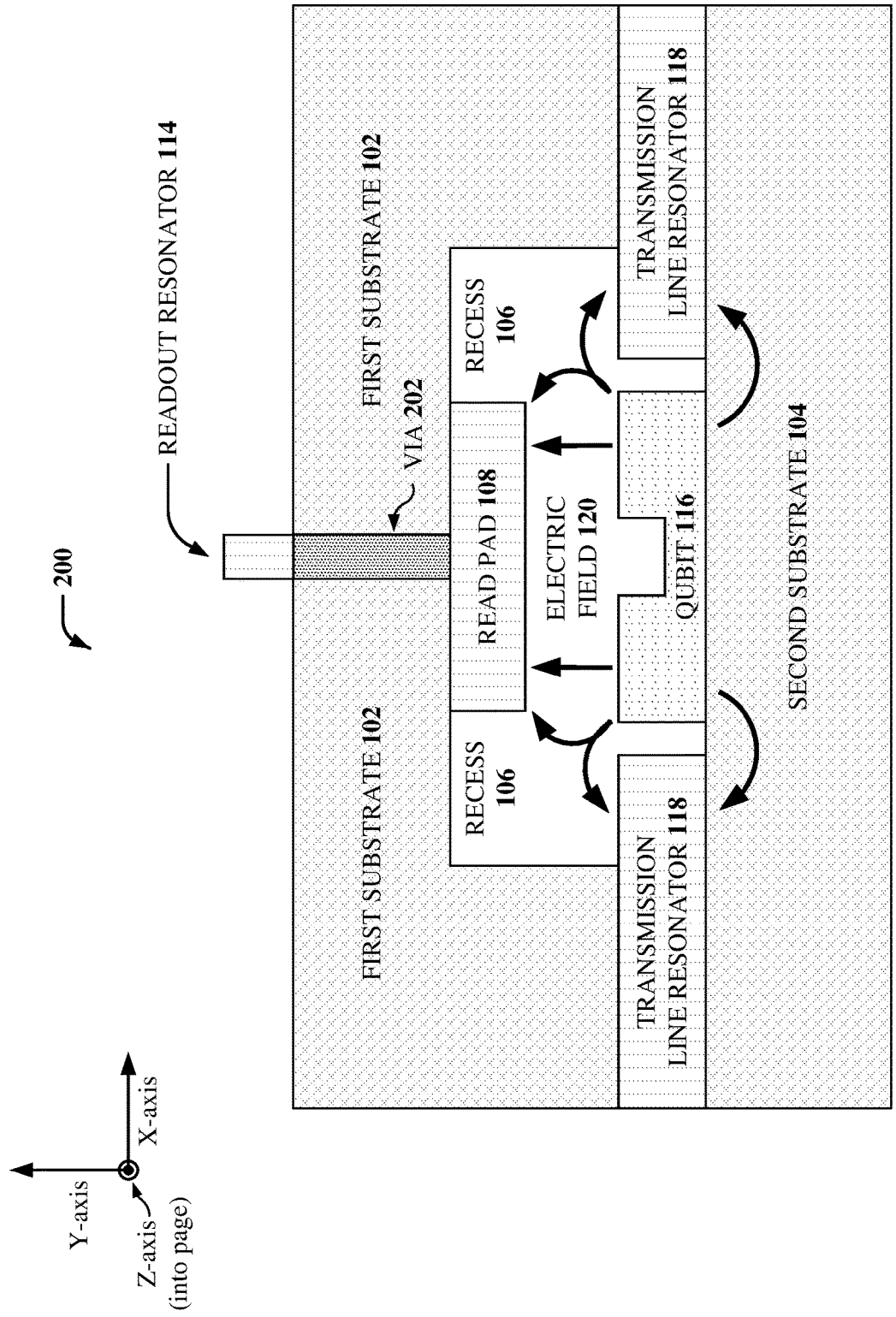
FIG. 2 illustrates a cross-sectional side view of an example, non-limiting vertical readout device that facilitates vertical dispersive readout of qubits of a lattice surface code architecture in accordance with one or more embodiments described herein.

FIG. 2 illustrates a cross-sectional side view of an example, non-limiting vertical readout device 200 that facilitates vertical dispersive readout of qubits of a lattice surface code architecture in accordance with one or more embodiments described herein. Repetitive description of like elements employed in other embodiments described herein is omitted for sake of brevity.

According to some embodiments, vertical readout device 200 can be an alternative example embodiment of vertical readout device 100. In such embodiments, vertical readout device 200 can be analogous to vertical readout device 100, except vertical readout device 200 can comprise via 202, rather than via 110 and/or via plate 112.

In several embodiments, via 202 can comprise material that completely fills the entire space of via 202 formed in first substrate 102. For example, via 202 can comprise material including, but not limited to, superconducting material, non-superconducting material, conductive material, non-conductive material, and/or another material.

In some embodiments, via 202 can be formed in first substrate 102 to establish an electrical connection between read pad 108 and readout resonator 114. For example, via 202 can comprise superconducting material or conductive material that can facilitate a conductive connection between read pad 108 and readout resonator 114. In another example, via 202 can comprise non-superconducting material or non-conductive material that can facilitate a capacitive coupling between read pad 108 and readout resonator 114.

In several embodiments, via 202 can be formed in first substrate 102 by employing photolithography techniques and material deposition techniques described above. For instance, via 202 can be formed in first substrate 102 (e.g., before forming readout resonators 114) by: applying a photomask and photoresist to the "top" side of first substrate 102 such that the desired geometric 2D shape of via 202 can be etched into first substrate 102; etching the first substrate 102 (e.g., via RIE) such that via 202 is formed in first substrate 102; filling via 202 with desired material such as, for example, a superconducting material (e.g., via CVD, PVD, MBE, ECD, etc.); and backgrinding such material such that the surface of the material is level (i.e., flush) with the "top" side of first substrate 102; (e.g., as illustrated in FIG. 2).

In some embodiments, via 202 can comprise a variety of shapes. For instance, the shape of via 202 can be defined in the 2D plane extending along the X-axis and Z-axis of FIG. 2 (e.g., as described above). In some embodiments, via 202 can be formed in first substrate 102 in such a manner to form shapes including, but not limited to, a circle, a square, a rectangle, a hexagon, an octagon, a diamond, and/or another shape that can be defined in such a 2D plane extending along the X-axis and Z-axis of FIG. 2.

In some embodiments, via 202 can comprise a variety of dimensions. For instance, the width (i.e., X-axis of FIG. 2), the height (i.e., Y-axis of FIG. 2), and/or the depth (i.e., Z-axis of FIG. 2) of via 202 can be fabricated to certain respective dimensions to enable optimized functionality of vertical readout device 200 and/or one or more components of vertical readout device 200 (e.g., to enable optimized electrical connection between read pad 108 and readout resonator 114, as described above). For example, in some embodiments, via 202 can be formed in first substrate 102 in such a manner to form a circular shape in the 2D plane extending along the X-axis and Z-axis of FIG. 2. In such an example, via 202 can comprise a diameter that is smaller than the width (i.e., X-axis of FIG. 2) and/or the depth (i.e., Z-axis of FIG. 2) of read pad 108. In still another example, via 202 can comprise a height (i.e., Y-axis of FIG. 2) that is less than one-tenth ($1/10$) the wavelength of an electromagnetic radiation wave output by qubit 116 (e.g., represented as electric field 120 in FIG. 1). For instance, via 202 can comprise a height $<<\lambda_{qbt}/10$ (e.g., as described above with reference to via 110 and FIG. 1).

Figure 3A:
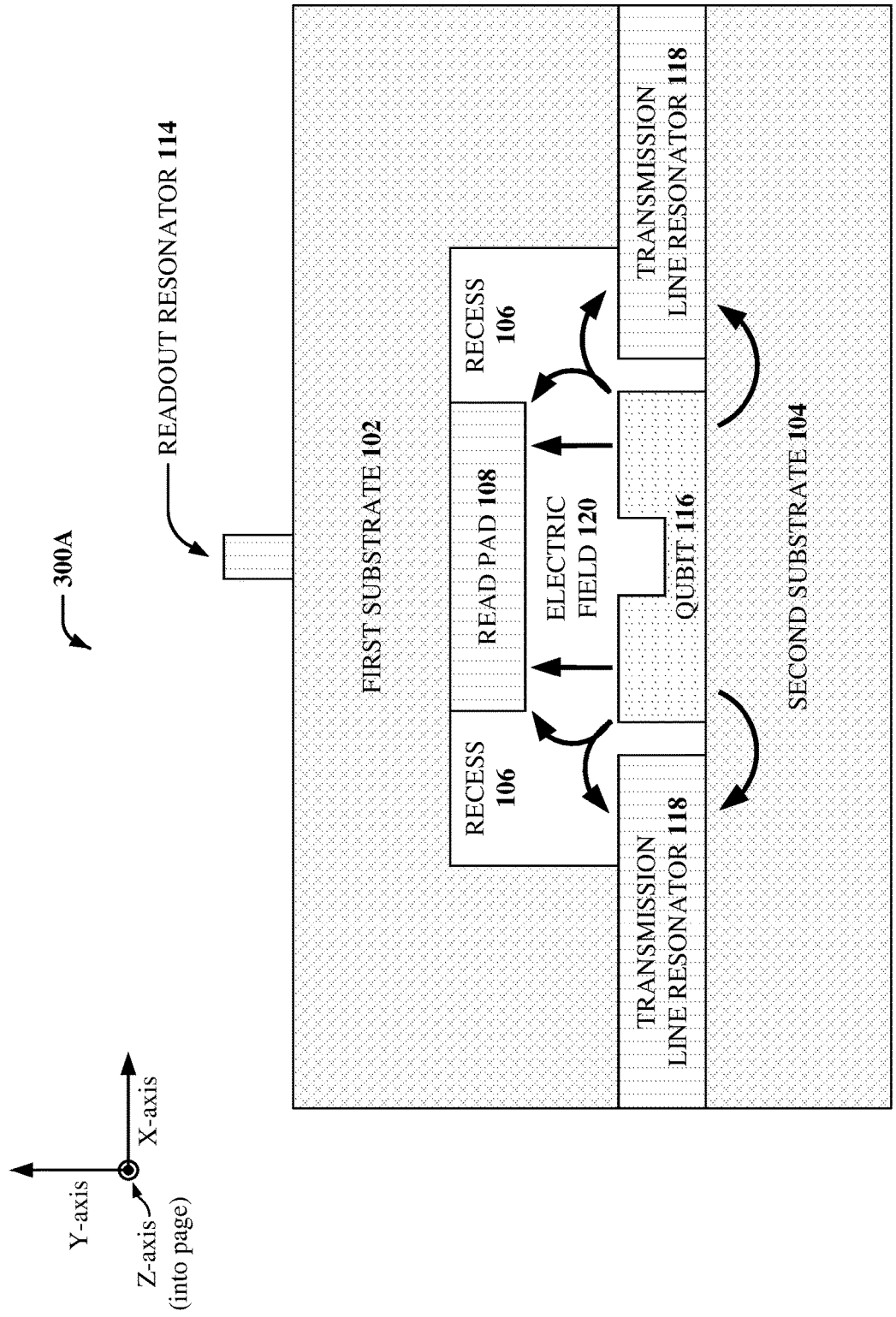
FIG. 3A illustrates a cross-sectional side view of an example, non-limiting vertical readout device that facilitates vertical dispersive readout of qubits of a lattice surface code architecture in accordance with one or more embodiments described herein.

FIG. 3A illustrates a cross-sectional side view of an example, non-limiting vertical readout device 300A that facilitates vertical dispersive readout of qubits of a lattice surface code architecture in accordance with one or more embodiments described herein. Repetitive description of like elements employed in other embodiments described herein is omitted for sake of brevity.

According to some embodiments, vertical readout device 300A can be an alternative example embodiment of vertical readout device 100. In such embodiments, vertical readout device 300A can be analogous to vertical readout device 100, except vertical readout device 300A can facilitate electrical coupling (e.g., capacitive coupling) between readout resonators 114 and read pad 108 without via 110 and/or via plate 112. For example, to facilitate such electrical coupling, first substrate 102 can comprise a dielectric material (e.g., $Al_2O_3$, Si, etc.), and readout resonator 114, as well as read pad 108, can comprise superconducting materials (e.g., Al, Nb, NbN, Ti, TiN, Ta, etc.).

Figure 3B:
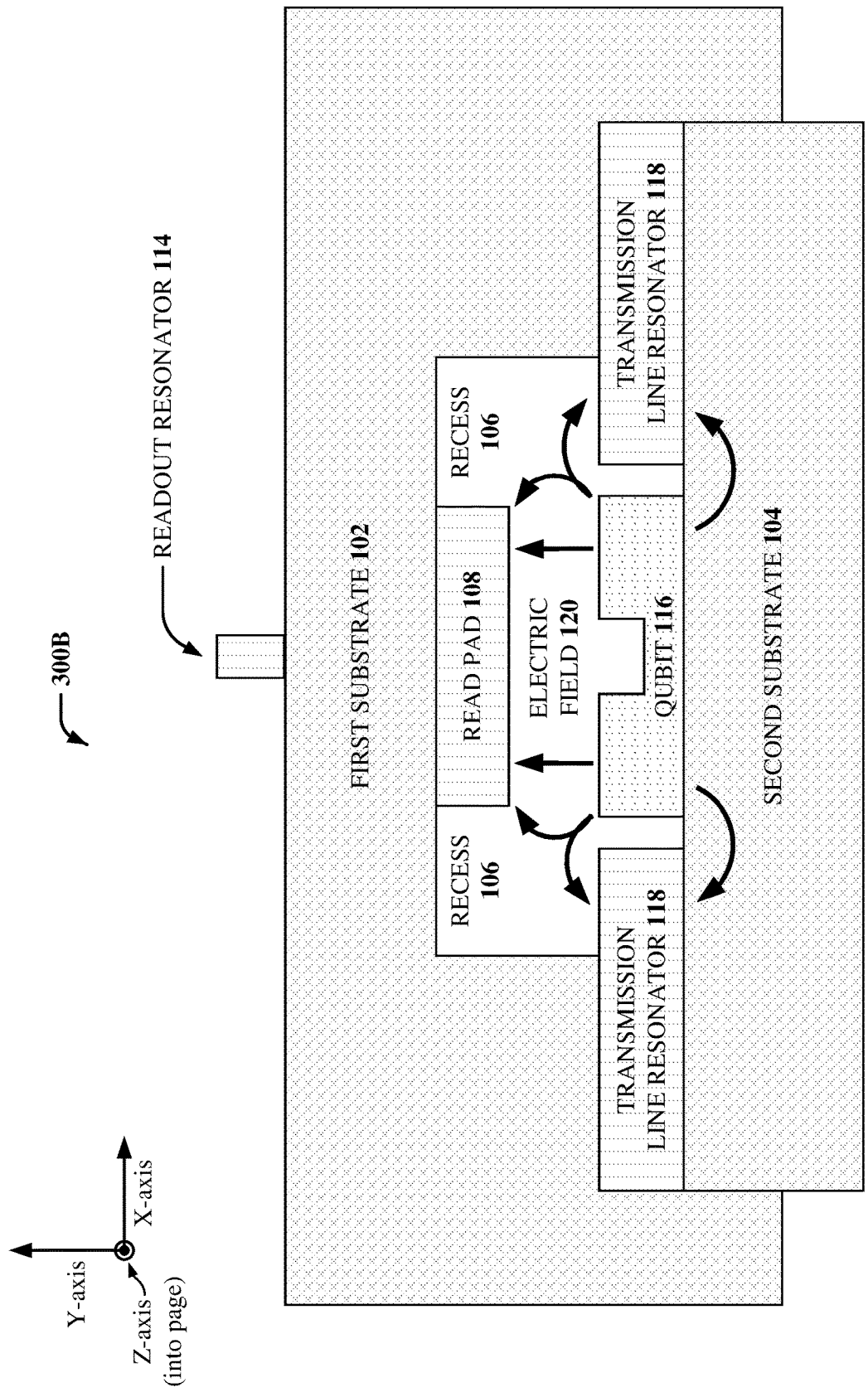
FIG. 3B illustrates a cross-sectional side view of an example, non-limiting vertical readout device that facilitates vertical dispersive readout of qubits of a lattice surface code architecture in accordance with one or more embodiments described herein.

FIG. 3B illustrates a cross-sectional side view of an example, non-limiting vertical readout device 300B that facilitates vertical dispersive readout of qubits of a lattice surface code architecture in accordance with one or more embodiments described herein. Repetitive description of like elements employed in other embodiments described herein is omitted for sake of brevity.

According to some embodiments, vertical readout device 300A can be an alternative example embodiment of vertical readout device 300B. In some embodiments, vertical readout device 300B can comprise first substrate 102 overlapping second substrate 104 to facilitate alignment of the "bottom" side of first substrate 102 and the "top" side of second substrate 104.

Figure 4:
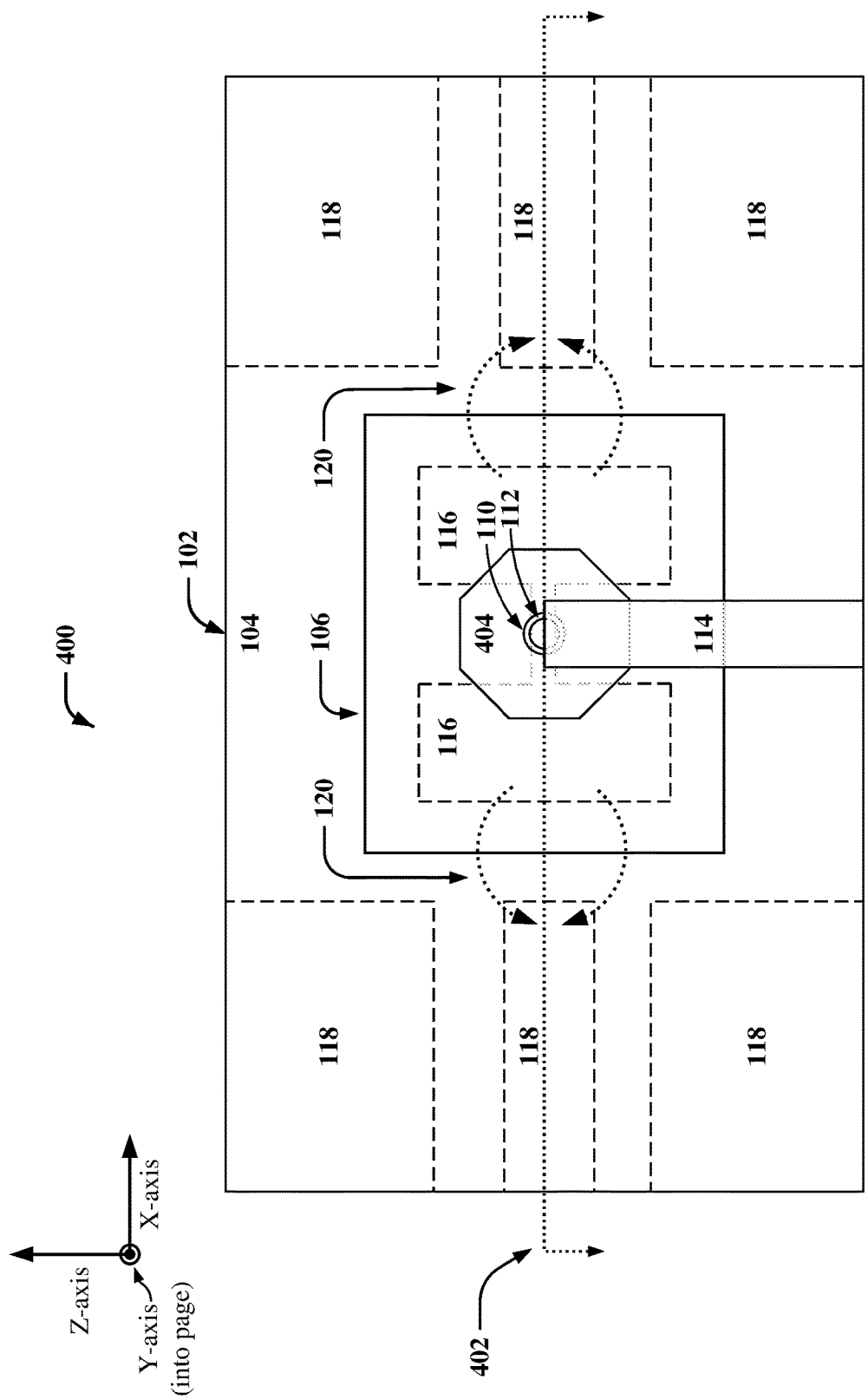
FIG. 4 illustrates a top view of an example, non-limiting vertical readout device that facilitates vertical dispersive readout of qubits of a lattice surface code architecture in accordance with one or more embodiments described herein.

FIG. 4 illustrates a top view of an example, non-limiting vertical readout device 400 that facilitates vertical dispersive readout of qubits of a lattice surface code architecture in accordance with one or more embodiments described herein.

In FIG. 4, dashed line 402 indicates where the cross-sectional side view of vertical readout device 100 occurs relative to vertical readout device 400. For purposes of clarity, components depicted as solid lines in the embodiment illustrated in FIG. 4 correspond with components of first substrate 102 shown in FIG. 1, and components depicted as dashed lines in the embodiment illustrated in FIG. 4 correspond with components of second substrate 104 shown in FIG. 1. Repetitive description of like elements employed in other embodiments described herein is omitted for sake of brevity.

According to some embodiments, vertical readout device 400 can be an alternative example embodiment of vertical readout device 100. In such embodiments, vertical readout device 400 can be analogous to vertical readout device 100, except vertical readout device 400 can comprise read pad 404, rather than read pad 108. For example, read pad 404 can comprise read pad 108 in an embodiment where read pad 108 comprises an octagonal shape.

Figure 5:
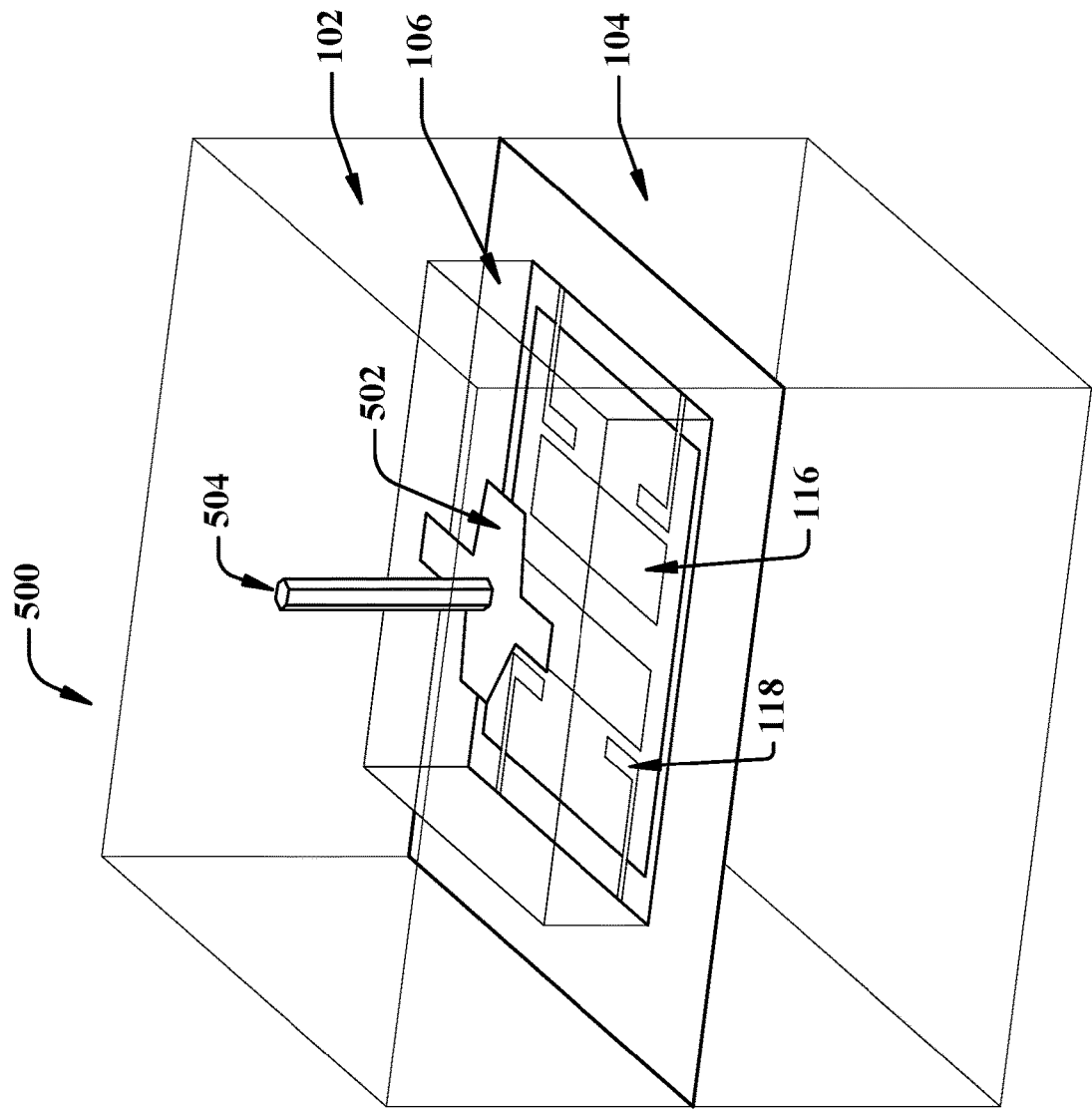
FIG. 5 illustrates an orthogonal view of an example, non-limiting vertical readout device that facilitates vertical dispersive readout of qubits of a lattice surface code architecture in accordance with one or more embodiments described herein.

FIG. 5 illustrates an orthogonal view of an example, non-limiting vertical readout device 500 that facilitates vertical dispersive readout of qubits of a lattice surface code architecture in accordance with one or more embodiments described herein. Repetitive description of like elements employed in other embodiments described herein is omitted for sake of brevity.

According to some embodiments, vertical readout device 500 can be an alternative example embodiment of vertical readout device 100. In such embodiments, vertical readout device 500 can be analogous to vertical readout device 100, except vertical readout device 500 can comprise read pad 502, rather than read pad 108, and via 504, rather than via 110. For example, read pad 502 can comprise read pad 108 in an embodiment where read pad 108 comprises a substantially cross shape, and via 504 can comprise via 110 in an embodiment where via 110 comprises a substantially circular shape.

FIG. 6A illustrates non-limiting example information 600A of simulated qubit frequency in accordance with one or more embodiments of the disclosed subject matter. In various embodiments, information 600A can comprise simulated qubit frequency information corresponding to a device simulating 2D planar readout of a qubit and a device simulating 3D vertical readout of a qubit (e.g., vertical readout device 100). In several embodiments, it should be appreciated that the difference between the simulated qubit frequency information corresponding to a device simulating 2D planar readout of a qubit and a device simulating 3D vertical readout of a qubit (e.g., vertical readout device 100) is negligible, and therefore, the simulated qubit frequency information corresponding to the respective 2D and 3D simulations can be substantially the same.

FIG. 6B illustrates non-limiting example information 600B of simulated capacitive coupling between readout pad and qubit in a two-dimensional (2D) approach and a vertical three-dimensional (3D) solution in accordance with one or more embodiments of the disclosed subject matter. In various embodiments, information 600B can comprise electromagnetic field simulation information (i.e., simulated coupling information) corresponding to a device simulating 2D planar readout of a qubit and a device simulating 3D vertical readout of a qubit (e.g., vertical readout device 100). In several embodiments, it should be appreciated that the difference between the electromagnetic field simulation information (i.e., simulated coupling information) corresponding to a device simulating 2D planar readout of a qubit and a device simulating 3D vertical readout of a qubit (e.g., vertical readout device 100) is negligible, and therefore, the electromagnetic field simulation information corresponding to the respective 2D and 3D simulations can be substantially the same.

Figure 7A:
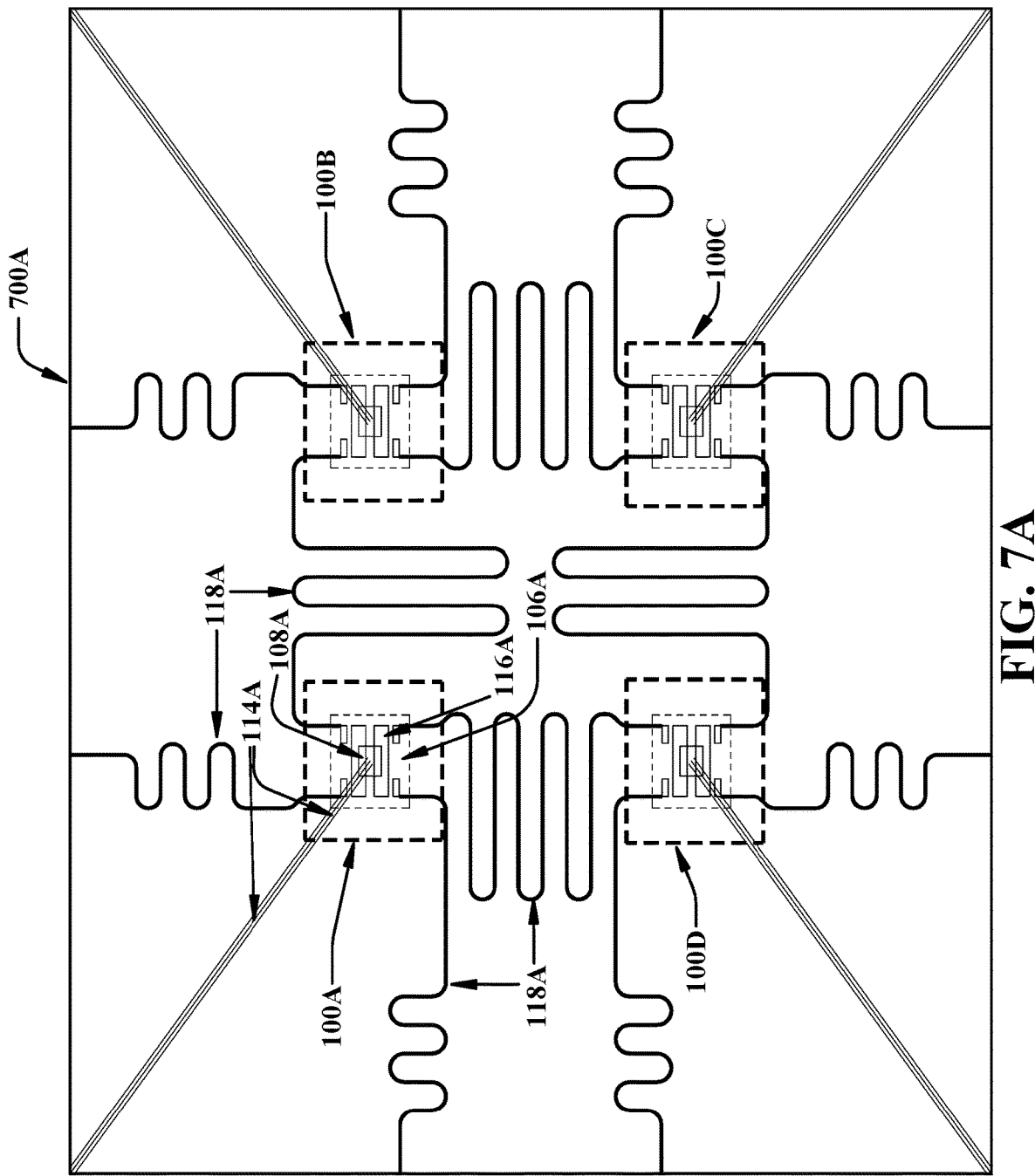
FIG. 7A illustrates a top view of an example, non-limiting scalable vertical readout device that facilitates vertical dispersive readout of qubits of a lattice surface code architecture in accordance with one or more embodiments described herein.

FIG. 7A illustrates a top view of an example, non-limiting scalable vertical readout device 700A that facilitates vertical dispersive readout of qubits of a lattice surface code architecture in accordance with one or more embodiments described herein. Repetitive description of like elements employed in other embodiments described herein is omitted for sake of brevity.

According to multiple embodiments, scalable vertical readout device 700A can be indicative of a scalable quantum computing architecture comprising superconducting quantum circuits that can be fabricated on a semiconducting device utilizing one or more techniques for fabricating an integrated circuit (e.g., as described above with reference to FIG. 1 and vertical readout device 100). For instance, in some embodiments, scalable vertical readout device 700A can be indicative of a scalable surface code architecture comprising one or more vertical readout devices 100A, 100B, 100C, 100D. As referenced herein, surface code architecture can comprise a quantum computing architecture having a plurality of qubits coupled to nearest-neighbor qubits and further coupled to microwave readout resonators. In some embodiments, scalable vertical readout device 700A can be indicative of a scalable surface code architecture comprising a lattice arrangement of a plurality of vertical readout devices 100A, 100B, 100C, 100D. In some embodiments, such a scalable lattice surface code architecture can be employed to implement an integrated quantum processor.

Although FIG. 7A depicts a quantity of four (4) vertical readout devices 100A, 100B, 100C, 100D, it should be appreciated that the embodiment shown in FIG. 7A is for illustration only, and as such, scalable vertical readout device 700A is not so limited. Further, although FIG. 7A depicts four (4) vertical readout devices 100A, 100B, 100C, 100D, for purposes of clarity, only vertical readout device 100A and its associated components are labeled in the embodiment shown in FIG. 7A. Nonetheless, it should be appreciated that, in some embodiments, vertical readout devices 100B, 100C, 100D can comprise the same components and functionality as vertical readout device 100A.

In some embodiments, scalable vertical readout device 700A can comprise a first substrate 102A (not labeled in FIG. 7A for clarity) and a second substrate 104A (not labeled in FIG. 7A for clarity) that can collectively comprise all respective components of vertical readout devices 100A, 100B, 100C, 100D described here. For example, scalable vertical readout device 700A can comprise first substrate 102A, which can comprise: recesses 106A, 106B, 106C, 106D; read pads 108A, 108B, 108C, 108D; vias 110A, 110B, 110C, 110D (not labeled in FIG. 7A for clarity); via plates 112A, 112B, 112C, 112D (not labeled in FIG. 7A for clarity); and/or readout resonators 114A, 114B, 114C, 114D. In such example, scalable vertical readout device 700A can further comprise second substrate 104A, which can comprise: qubits 116A, 116B, 116C, 116D; and/or transmission line resonators 118A, 118B, 118C, 118D.

In some embodiments, first substrate 102A can comprise first substrate 102 of vertical readout device 100. In some embodiments, second substrate 104A can comprise second substrate 104 of vertical readout device 100. In some embodiments, recesses 106A, 106B, 106C, 106D can respectively comprise recess 106 of vertical readout device 100. In some embodiments, read pads 108A, 108B, 108C, 108D can respectively comprise read pad 108 of vertical readout device 100. In some embodiments, vias 110A, 110B, 110C, 110D can respectively comprise via 110 of vertical readout device 100. In some embodiments, via plates 112A, 112B, 112C, 112D can respectively comprise via plate 112 of vertical readout device 100. In some embodiments, readout resonators 114A, 114B, 114C, 114D can respectively comprise readout resonator 114 of vertical readout device 100. In some embodiments, qubits 116A, 116B, 116C, 116D can respectively comprise qubit 116 of vertical readout device 100. In some embodiments, transmission line resonators 118A, 118B, 118C, 118D can respectively comprise transmission line resonators 118 of vertical readout device 100.

In some embodiments, first substrate 102A can be connected to second substrate 104A (e.g., as described above with reference to first substrate 102, second substrate 104, and FIG. 1). In some embodiments, qubits 116A, 116B, 116C, 116D can be electrically coupled to respective transmission line resonators 118A, 118B, 118C, 118D (e.g., as described above with reference to qubit 116, transmission line resonators 118, and FIG. 1). In some embodiments, vias 110A, 110B, 110C, 110D can electrically connect readout resonators 114A, 114B, 114C, 114D that can be located on a first side (e.g., a "top" side) of first substrate 102A, to respective read pads 108A, 108B, 108C, 108D that can be located on a second side (e.g., a "bottom" side) of first substrate 102A that can be opposite the first side of first substrate 102A (e.g., as described above with reference to read pad 108, via 110, readout resonators 114, and FIG. 1).

Figure 7B:
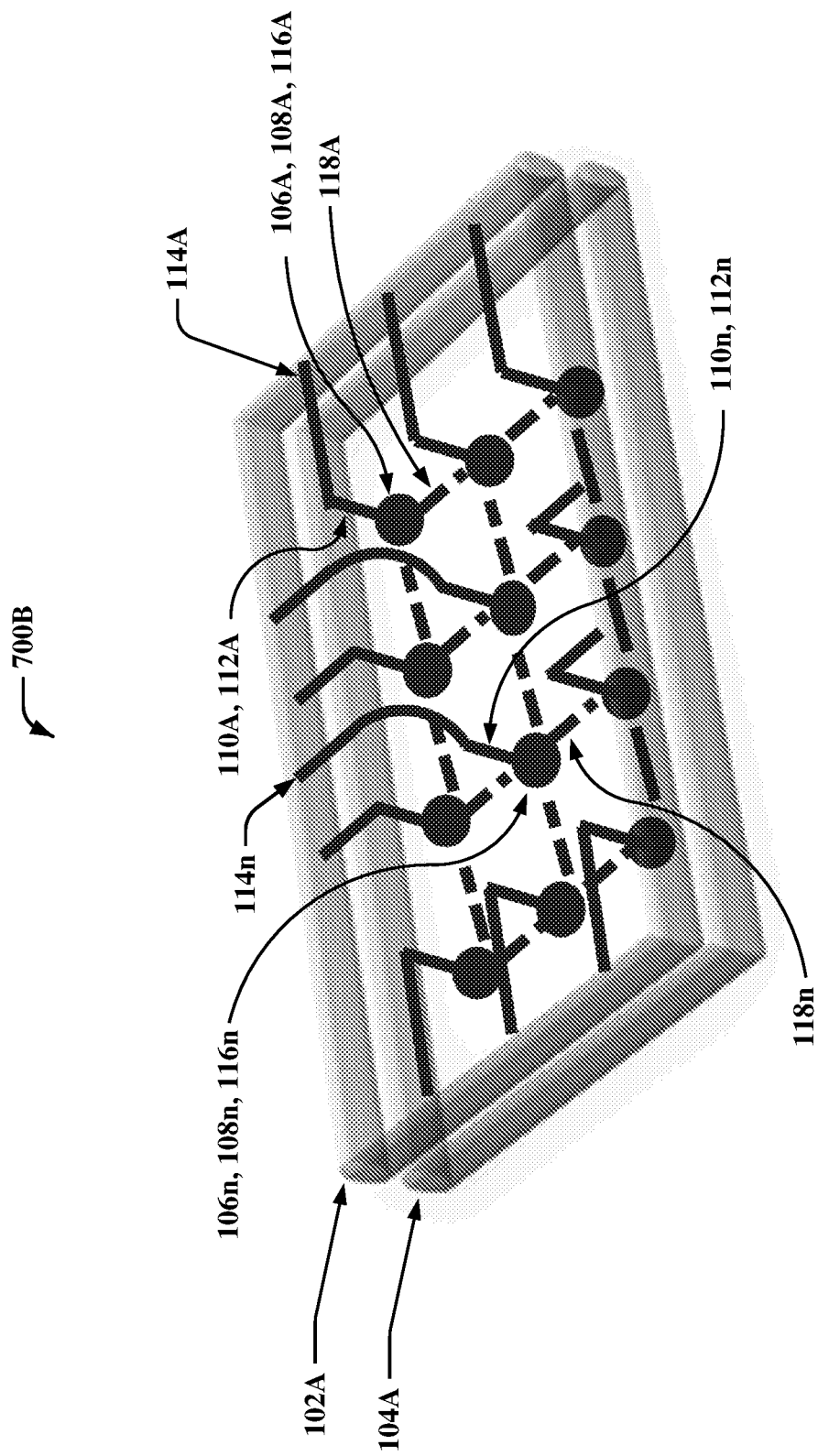
FIG. 7B illustrates an orthogonal view of an example, non-limiting scalable vertical readout device 700B that facilitates vertical dispersive readout of qubits of a lattice surface code architecture in accordance with one or more embodiments described herein.

FIG. 7B illustrates an orthogonal view of an example, non-limiting scalable vertical readout device 700B that facilitates vertical dispersive readout of qubits of a lattice surface code architecture in accordance with one or more embodiments described herein. Repetitive description of like elements employed in other embodiments described herein is omitted for sake of brevity.

According to some embodiments, scalable vertical readout device 700B can be an alternative example embodiment of scalable vertical readout device 700A. In such embodiments, scalable vertical readout device 700B can be analogous to scalable vertical readout device 700A, except scalable vertical readout device 700B can comprise an indefinite number of vertical readout devices 100$n$ (not labeled in FIG. 7B for clarity), which can comprise vertical readout devices 100 (and/or alternative embodiments thereof, as described herein). For example, scalable vertical readout device 700B can comprise "n" number of vertical readout devices 100$n$, where "n" represents a total quantity of vertical readout devices 100 (and/or alternative embodiments thereof, as described herein). For instance, scalable vertical readout device 700B can comprise vertical readout devices 100A, 100B, 100C, 100D to vertical readout device 100$n$. Although FIG. 7B depicts a quantity of twelve (12) vertical readout devices 100 (e.g., vertical readout device 100A to vertical readout device 100$n$), it should be appreciated that the embodiment shown in FIG. 7B is for illustration only, and as such, scalable vertical readout device 700B is not so limited.

In some embodiments, scalable vertical readout device 700B can comprise vertical readout device 100$n$ (not labeled in FIG. 7B for clarity). In such embodiments, vertical readout device 100$n$ can comprise vertical readout device 100A described above with reference to FIG. 7A. For example, vertical readout device 100$n$ can comprise: a recess 106$n$; a read pad 108$n$; a via 110$n$; a via plate 112$n$; a readout resonator 114$n$; a qubit 116$n$; and/or one or more transmission line resonators 118$n$. In some embodiments, recess 106$n$ can comprise recess 106A of vertical readout device 100A. In some embodiments, read pad 108$n$ can comprise read pad 108A of vertical readout device 100A. In some embodiments, via 110$n$ can comprise via 110A of vertical readout device 100A. In some embodiments, via plate 112$n$ can comprise via plate 112A of vertical readout device 100A. In some embodiments, readout resonator 114$n$ can comprise readout resonator 114A of vertical readout device 100A. In some embodiments, qubit 116$n$ can comprise qubit 116A of vertical readout device 100A. In some embodiments, transmission line resonators 118$n$ can comprise transmission line resonators 118A of vertical readout device 100A.

In some embodiments, vertical readout device 100$n$ can be positioned at a lattice point that is located inside the lattice surface code architecture of scalable vertical readout device 700B. For example, vertical readout device 100$n$ can be positioned at a lattice point that is not along the perimeter of the lattice surface code architecture of scalable vertical readout device 700B. For instance, vertical readout device 100$n$ can be positioned at a lattice point located substantially at the center of the lattice surface code architecture of scalable vertical readout device 700B, as illustrated in the embodiment depicted in FIG. 7B. In such an example, scalable vertical readout device 700B can be fabricated such that readout resonator 114$n$ can be routed to via 110$n$ and/or via plate 112$n$, for instance, as illustrated in the embodiment depicted in FIG. 7B.

According to numerous embodiments, as scalable vertical readout device 700B can facilitate readout of a plurality of qubits 116$n$ located substantially at the center of the lattice surface code architecture of scalable vertical readout device 700B, it should be appreciated that scalable vertical readout device 700B can enable realization of a scalable vertical quantum computing lattice surface code architecture. In these embodiments, such a scalable vertical quantum computing lattice surface code architecture can comprise an indefinite quantity of qubits 116$n$ located on second substrate 104A, where such qubits 116$n$ can be coupled to one another via transmission line resonators 118$n$ and can further be dispersively addressed by respective readout resonators 114$n$ located on first substrate 102A.

According to such embodiments, it should be further appreciated that scalable vertical readout device 700B can be advantageous over existing planar quantum computing surface code architectures that employ planar readout resonators to address qubits located on the same plane as the planar readout resonators. For example, scalable vertical readout device 700B can be advantageous over such existing planar quantum computing surface code architectures by comprising an indefinite number of qubits 116$n$ that can be employed by a quantum processor to execute computations and/or information processing functions that are more complex than those that can be executed using existing planar quantum computing surface code architectures. In these embodiments, it should also be appreciated that scalable vertical readout device 700B can be advantageous over existing planar quantum computing surface code architectures, as such indefinite number of qubits 116$n$ can be employed by a quantum processor to execute complex computations and/or information processing functions faster (i.e., in less time) than existing quantum processors using existing planar quantum computing surface code architectures. Accordingly, as scalable vertical readout device 700B can comprise an indefinite number of qubits 116$n$ that can be employed by a quantum processor to more quickly execute more complex computations and/or information processing functions, scalable vertical readout device 700B can therefore facilitate improved performance, processing capacity, processing time, and/or processing efficiency of a quantum processor comprising scalable vertical readout device 700B.

In some embodiments, vertical readout device 100, 200, 300A, 300B, 400, 500 and/or scalable vertical readout device 700A, 700B can be a vertical dispersive qubit readout device, system, and/or process associated with various technologies. For example, vertical readout device 100, 200, 300A, 300B, 400, 500 and/or scalable vertical readout device 700A, 700B can be associated with quantum bit (qubit) technologies, quantum circuit technologies, superconducting quantum circuit technologies, circuit quantum electrodynamics (cQED) technologies, quantum computing technologies, quantum processor technologies, superconductor device fabrication technologies, semiconductor device fabrication technologies, scalable quantum computing architecture technologies, surface code architecture technologies, surface code error correction architecture technologies, quantum hardware technologies, and/or other technologies.

In some embodiments, vertical readout device 100, 200, 300A, 300B, 400, 500 and/or scalable vertical readout device 700A, 700B can provide technical improvements to systems, devices, components, operational steps, and/or processing steps associated with the various technologies listed above. For example, vertical readout device 100, 200, 300A, 300B, 400, 500 and/or scalable vertical readout device 700A, 700B can enable vertical dispersive readout of respective qubits located on one substrate using readout resonators located on a different substrate. In this example, it should be appreciated that, according to several embodiments, vertical readout device 100, 200, 300A, 300B, 400, 500 and/or scalable vertical readout device 700A, 700B can enable realization of a scalable vertical quantum computing lattice surface code architecture comprising a plurality of qubits located on one substrate that are communicatively and/or electrically coupled to other qubits located on the same substrate (e.g., via resonant buses), where the respective qubits are vertically addressed using readout resonators located on a different substrate. For instance, it should be appreciated that, in numerous embodiments, vertical readout device 100, 200, 300A, 300B, 400, 500 and/or scalable vertical readout device 700A, 700B can enable vertical dispersive readout of qubits located substantially at the center (i.e., not just qubits located along the perimeter) of a lattice surface code architecture fabricated on a semiconducting device, thereby enabling implementation of a fully-scaled quantum processor that can be employed to implement a quantum computing device (e.g., a quantum computer).

In some embodiments, vertical readout device 100, 200, 300A, 300B, 400, 500 and/or scalable vertical readout device 700A, 700B can provide technical improvements to systems, devices, components, operational steps, and/or processing steps associated with the various technologies listed above by providing for consistent (i.e., constant) and optimized capacitive coupling necessary to address a qubit before the quantum information of the qubit is lost due to decoherence. For example, as described above with reference to FIG. 1, recess 106 can be etched to a depth determined to enable optimized capacitive coupling between read pad 108 and qubit 116, and as such depth will not fluctuate, such optimized capacitive coupling will not fluctuate, thereby enabling consistent and optimized capacitive coupling necessary to address qubit 116 before the quantum information of qubit 116 is lost due to decoherence.

In some embodiments, vertical readout device 100, 200, 300A, 300B, 400, 500 and/or scalable vertical readout device 700A, 700B can provide technical improvements to systems, devices, components, operational steps, and/or processing steps associated with the various technologies listed above by enabling dissipation of an electric field output by a qubit into air and/or a vacuum of a recess of vertical readout device 100, thereby reducing the electrical coupling of such electric field to other components of vertical readout device 100, which reduces cross-talk and loss of electrical energy (e.g., dielectric loss). For example, vertical readout device 100 can enable dissipation of electric field 120 in recess 106, as electromagnetic radiation waves of such electric field 120 can propagate into recess 106 and substantially couple to the air of recess 106, rather than other components of vertical readout device 100. In this example, such dissipation of electric field 120 in recess 106 facilitates reduced cross-talk between qubit 116 and one or more other qubits electrically coupled to qubit 116 via transmission line resonators 118. Continuing with this example, such dissipation of electric field 120 in recess 106 facilitates reduced unintended loss of electrical energy (e.g., dielectric loss) into one or more components of vertical readout device 100 (e.g., first substrate 102, second substrate 104, transmission line resonators 118, etc.).

In some embodiments, vertical readout device 100, 200, 300A, 300B, 400, 500 and/or scalable vertical readout device 700A, 700B can provide technical improvements to systems, devices, components, operational steps, and/or processing steps associated with the various technologies listed above by employing fewer and less complex components that can be easily fabricated using one or more techniques for fabricating an integrated circuit. For example, as described above with reference to FIG. 1, vertical readout device 100 does not comprise complex components that are difficult to fabricate and/or assemble, which can result in a device malfunction (e.g., components requiring precise alignment and/or insertion into other components). In another example, as described above with reference to FIG. 1, vertical readout device 100 does not comprise more than two (2) substrate layers that respectively comprise one or more additional components (e.g., three (3) or more substrate layers electrically connected by bump bonds and/or TSV's).

In some embodiments, vertical readout device 100, 200, 300A, 300B, 400, 500 and/or scalable vertical readout device 700A, 700B can provide technical improvements to a processing unit associated with vertical readout device 100, 200, 300A, 300B, 400, 500 and/or scalable vertical readout device 700A, 700B. For example, as described above with reference to FIG. 1, vertical readout device 100 can facilitate consistent (i.e., constant) and optimized capacitive coupling necessary to address a qubit before the quantum information of the qubit is lost due to decoherence. In this example, by optimizing such capacitive coupling and readout of a qubit, fewer processing cycles are required to achieve the same readout result, thereby facilitating improved processing efficiency of a processing unit comprising vertical readout device 100 (e.g., a superconducting quantum processor), resulting in reduced power consumption by such processing unit. In another example, as described above with reference to FIG. 1, vertical readout device 100 can facilitate dissipation of an electric field output by a qubit into air and/or a vacuum of a recess of vertical readout device 100, which reduces cross-talk and electrical energy loss (e.g., dielectric loss). In this example, by reducing such cross-talk and electrical energy loss, fewer processing cycles are required to achieve the same readout result, thereby facilitating improved processing efficiency of a processing unit comprising vertical readout device 100 (e.g., a superconducting quantum processor), resulting in reduced power consumption by such processing unit.

In some embodiments, vertical readout device 100, 200, 300A, 300B, 400, 500 and/or scalable vertical readout device 700A, 700B can employ hardware and/or software to solve problems that are highly technical in nature, that are not abstract and that cannot be performed as a set of mental acts by a human. For example, vertical readout device 100, 200, 300A, 300B, 400, 500 and/or scalable vertical readout device 700A, 700B can facilitate vertical dispersive readout of quantum information of an indefinite quantity of qubits.

It is to be appreciated that vertical readout device 100, 200, 300A, 300B, 400, 500 and/or scalable vertical readout device 700A, 700B can perform a vertical dispersive qubit readout process utilizing various combinations of electrical components, mechanical components, and circuitry (e.g., superconducting quantum circuits) that cannot be replicated in the mind of a human or performed by a human. For example, vertically addressing the logic states of a qubit comprises operations that are greater than the capability of a human mind. For instance, the amount of data processed, the speed of processing such data, and/or the types of data processed by vertical readout device 100, 200, 300A, 300B, 400, 500 and/or scalable vertical readout device 700A, 700B over a certain period of time can be greater, faster, and/or different than the amount, speed, and/or data type that can be processed by a human mind over the same period of time.

According to several embodiments, vertical readout device 100, 200, 300A, 300B, 400, 500 and/or scalable vertical readout device 700A, 700B can also be fully operational towards performing one or more other functions (e.g., fully powered on, fully executed, etc.) while also performing the above-referenced vertical dispersive qubit readout process. It should also be appreciated that such simultaneous multi-operational execution is beyond the capability of a human mind. It should also be appreciated that vertical readout device 100, 200, 300A, 300B, 400, 500 and/or scalable vertical readout device 700A, 700B can include information that is impossible to obtain manually by an entity, such as a human user. For example, the type, amount, and/or variety of information included in readout resonator 114, qubit 116, transmission line resonators 118, and/or electric field 120 can be more complex than information obtained manually by a human user.

Figure 8:
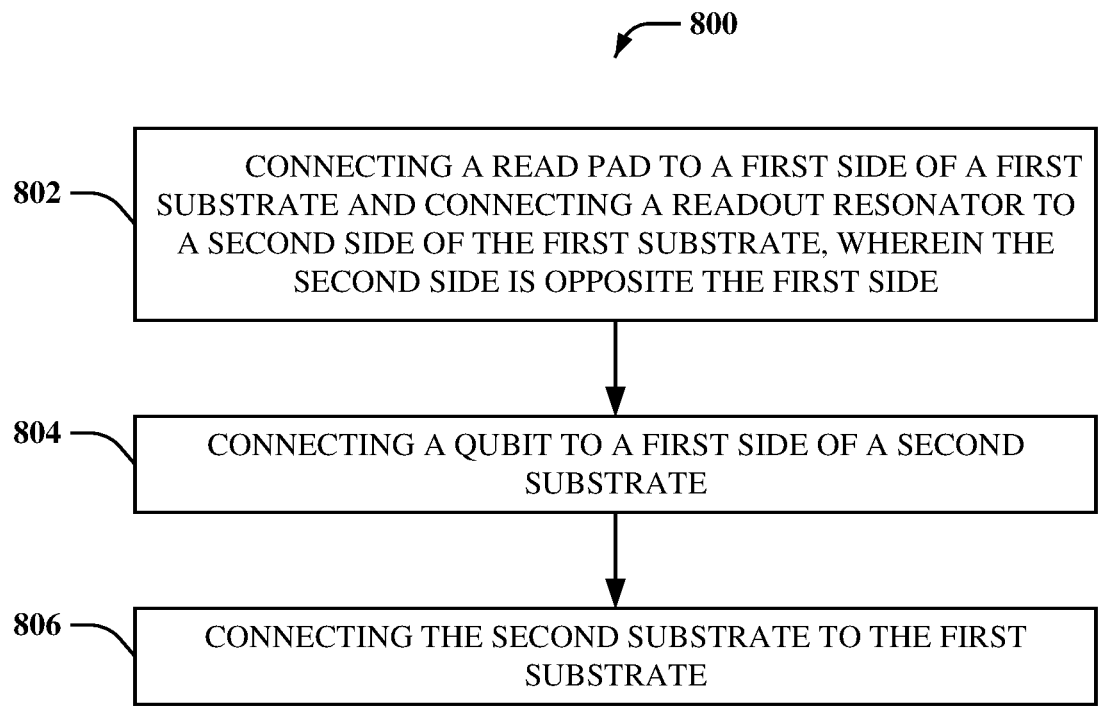
FIG. 8 illustrates a flow diagram of an example, non-limiting method 800 that facilitates implementing a vertical dispersive readout device in accordance with one or more embodiments described herein.

FIG. 8 illustrates a flow diagram of an example, non-limiting method 800 that facilitates implementing a vertical dispersive readout device in accordance with one or more embodiments described herein. Repetitive description of like elements employed in other embodiments described herein is omitted for sake of brevity.

In some embodiments, method 800 can be implemented by a computing system (e.g., operating environment 1000 illustrated in FIG. 10 and described below) and/or a computing device (e.g., computer 1012 illustrated in FIG. 10 and described below). In non-limiting example embodiments, such computing system (e.g., operating environment 1000) and/or such computing device (e.g., computer 1012) can comprise one or more processors and one or more memory devices that can store executable instructions thereon that, when executed by the one or more processors, can facilitate performance of the operations described herein, including the non-limiting operations of method 800 illustrated in FIG. 8. As a non-limiting example, the one or more processors can facilitate performance of the operations described herein, for example, method 800, by directing or controlling one or more systems and/or equipment operable to perform semiconductor fabrication.

At 802, connecting (e.g., via computer 1012) a read pad (e.g., read pad 108) to a first side (e.g., a "bottom" side) of a first substrate (e.g., first substrate 102) and connecting a readout resonator (e.g., readout resonator 114) to a second side (e.g., a "top" side) of the first substrate. In some embodiments, the second side of the first substrate can be opposite the first side of the first substrate. At 804, connecting (e.g., via computer 1012) a qubit (e.g., qubit 116) to a first side (e.g., a "top" side) of a second substrate (e.g., second substrate 104). At 806, connecting (e.g., via computer 1012) the second substrate to the first substrate.

In some embodiments, such connecting of operations 802, 804, and 806 can be performed (e.g., via computer 1012) by employing one or more integrated circuit fabrication techniques described above with reference to first substrate 102, second substrate 104, read pad 108, readout resonator 114, qubit 116, and FIG. 1. It should be appreciated that such connecting of operations 802, 804, and 806 can facilitate the advantage of scaling, for example, as described above with reference to scalable vertical readout device 700B and FIG. 7B.

Figure 9:
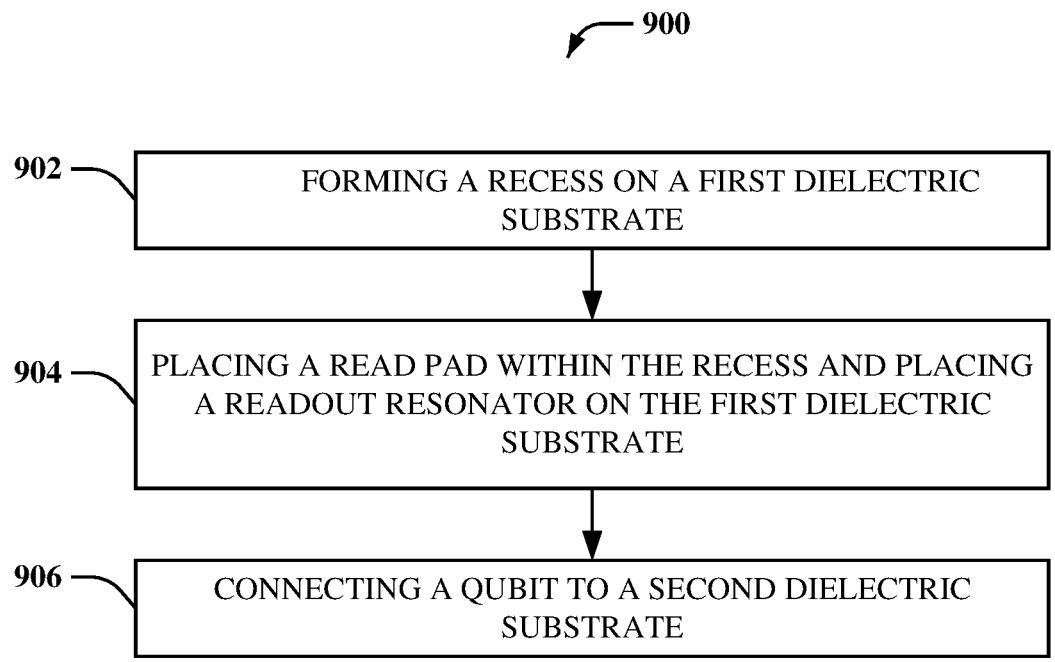
FIG. 9 illustrates a flow diagram of an example, non-limiting method 900 that facilitates implementing a vertical dispersive readout device in accordance with one or more embodiments described herein.

FIG. 9 illustrates a flow diagram of an example, non-limiting method 900 that facilitates implementing a vertical dispersive readout device in accordance with one or more embodiments described herein. Repetitive description of like elements employed in other embodiments described herein is omitted for sake of brevity.

In some embodiments, method 900 can be implemented by a computing system (e.g., operating environment 1000 illustrated in FIG. 10 and described below) and/or a computing device (e.g., computer 1012 illustrated in FIG. 10 and described below). In non-limiting example embodiments, such computing system (e.g., operating environment 1000) and/or such computing device (e.g., computer 1012) can comprise one or more processors and one or more memory devices that can store executable instructions thereon that, when executed by the one or more processors, can facilitate performance of the operations described herein, including the non-limiting operations of method 900 illustrated in FIG. 9. As a non-limiting example, the one or more processors can facilitate performance of the operations described herein, for example, method 900, by directing or controlling one or more systems and/or equipment operable to perform semiconductor fabrication.

At 902, forming (e.g., via computer 1012) a recess (e.g., recess 106) on a first dielectric substrate (e.g., on a "bottom" side of first substrate 102). In some embodiments, such forming of operation 902 can be performed (e.g., via computer 1012) by employing one or more integrated circuit fabrication techniques described above with reference to recess 106 and FIG. 1.

At 904, placing (e.g., via computer 1012) a read pad (e.g., read pad 108) within the recess (e.g., on a side of recess 106, such as a "ceiling" side of recess 106) and placing a readout resonator (e.g., readout resonator 114) on the first dielectric substrate (e.g., on a "top" side of first substrate 102). In some embodiments, the second side of the first dielectric substrate can be opposite the first side of the first dielectric substrate. In some embodiments, such placing of operation 904 can be performed (e.g., via computer 1012) by employing one or more integrated circuit fabrication techniques described above with reference to read pad 108 and FIG. 1.

At 906, connecting (e.g., via computer 1012) a qubit (e.g., qubit 116) to a second dielectric substrate (e.g., a "top" side of second substrate 104). In some embodiments, such connecting of operation 906 can be performed (e.g., via computer 1012) by employing one or more integrated circuit fabrication techniques described above with reference to qubit 116 and FIG. 1.

It should be appreciated that operations 902, 904, and 906 (e.g., forming a recess, placing a read pad within the recess, placing a readout resonator on the first dielectric substrate, and connecting a qubit to a second dielectric substrate, respectively), can facilitate the advantage of improved and consistent capacitive coupling between the read pad and the qubit by enabling an electric field (e.g., electric field 120) output from the qubit to be substantially directed toward the read pad (e.g., as opposed to being directed toward components adjacent to the qubit). It should also be appreciated that by enabling such an electric field output from the qubit to be substantially directed toward the read pad (e.g., as opposed to being directed toward components adjacent to the qubit) can further facilitate the advantages of: reducing cross-talk between the qubit and one or more second qubits (e.g., qubits 116A, 116B, 116C, 116D, 116n as described above with reference to FIG. 7A and FIG. 7B); or reducing loss of an electric field (e.g., electric field 120) output by the qubit. It should be further appreciated that operations 902, 904, and 906 can facilitate the advantage of scaling, for example, as described above with reference to scalable vertical readout device 700B and FIG. 7B.

For simplicity of explanation, the methodologies described herein (e.g., computer-implemented methodologies) are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the methodologies described herein (e.g., computer-implemented methodologies) in accordance with the disclosed subject matter. In addition, those skilled in the art will understand and appreciate that the such methodologies could alternatively be represented as a series of interrelated states via a state diagram or events. Additionally, it should be further appreciated that the methodologies (e.g., computer-implemented methodologies) disclosed hereinafter and throughout this specification are capable of being stored on an article of manufacture to facilitate transporting and transferring such methodologies (e.g., computer-implemented methodologies) to computers. The term article of manufacture, as used herein, is intended to encompass a computer program accessible from any computer-readable device or storage media.

Figure 10:
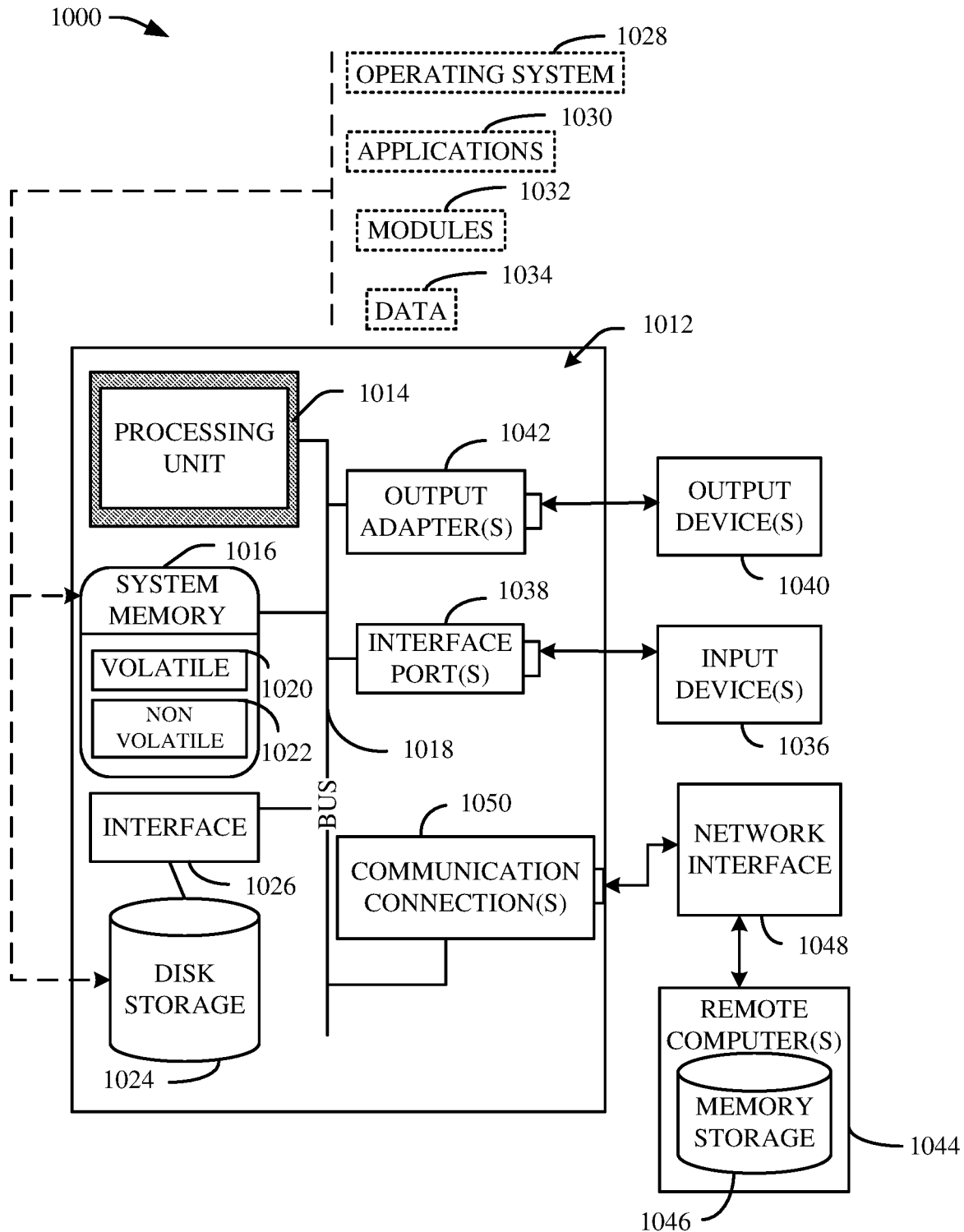
FIG. 10 illustrates a block diagram of an example, non-limiting operating environment in which one or more embodiments described herein can be facilitated.

In order to provide a context for the various aspects of the disclosed subject matter, FIG. 10 as well as the following discussion are intended to provide a general description of a suitable environment in which the various aspects of the disclosed subject matter can be implemented. FIG. 10 illustrates a block diagram of an example, non-limiting operating environment in which one or more embodiments described herein can be facilitated. For example, operating environment 1000 can be used to implement the example, non-limiting method 800 of FIG. 8 and/or non-limiting method 900 of FIG. 9, both of which facilitate implementing a vertical readout device 100, 200, 300A, 300B, 400, and/or 500 of FIGS. 1, 2, 3A, 3B, 4, and/or 5, respectively. Repetitive description of like elements employed in other embodiments described herein is omitted for sake of brevity.

With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1016 can also include volatile memory 1020 and nonvolatile memory 1022. The basic input/output system (BIOS), containing the basic routines to transfer information between elements within the computer 1012, such as during start-up, is stored in nonvolatile memory 1022. Computer 1012 can also include removable/non-removable, volatile/nonvolatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media. To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012.

System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DR-RAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
   a first dielectric substrate comprising a recess, a via, a readout resonator positioned at the via, and a read pad; and
   a second dielectric substrate connected to the first dielectric substrate at the recess and forming a cavity, the second dielectric substrate comprising a qubit within the cavity and wherein the read pad is located within the cavity.

2. The device of claim 1, further comprising one or more transmission line resonators located on the second dielectric substrate.

3. The device of claim 2, wherein the one or more transmission line resonators electrically couple to the qubit.

4. The device of claim 1, wherein the read pad is connected to a side of the cavity, thereby facilitating at least one of: improved capacitive coupling between the read pad and the qubit; reduced cross-talk between the qubit and a second qubit of the device; or reduced loss of an electric field output by the qubit.

5. The device of claim 1, wherein the qubit is selected from a group consisting of a transmon qubit, a planar qubit, a charge qubit, a flux qubit, a phase qubit, and a vertical qubit.

* * * * *